(12) United States Patent
Nakao et al.

(10) Patent No.: US 11,007,897 B2
(45) Date of Patent: May 18, 2021

(54) HYBRID VEHICLE AND METHOD FOR CONTROLLING SAME

(71) Applicants: Toyota Jidosha Kabushiki Kaisha, Toyota (JP); DENSO TEN Limited, Kobe (JP)

(72) Inventors: Yu Nakao, Toyota (JP); Koji Hokoi, Toyota (JP); Yoshimitsu Takahashi, Miyoshi (JP); Yoshihiro Uchida, Nagakute (JP); Kazuki Furuta, Toyota (JP); Kazuto Roppongi, Kobe (JP)

(73) Assignees: Toyota Jidosha Kabushiki Kaisha, Toyota (JP); DENSO Ten Limited, Kobe (JP)

( * ) Notice: Subject to any disclaimer, the term of this patent is extended or adjusted under 35 U.S.C. 154(b) by 234 days.

(21) Appl. No.: 16/299,480

(22) Filed: Mar. 12, 2019

(65) Prior Publication Data

US 2019/0283624 A1    Sep. 19, 2019

(30) Foreign Application Priority Data

Mar. 14, 2018    (JP) .............................. JP2018-047080

(51) Int. Cl.
| | |
|---|---|
| *B60L 58/13* | (2019.01) |
| *B60L 58/16* | (2019.01) |
| *B60L 50/61* | (2019.01) |
| *G01R 31/392* | (2019.01) |
| *B60L 3/00* | (2019.01) |

(52) U.S. Cl.
CPC ............. *B60L 58/13* (2019.02); *B60L 3/0046* (2013.01); *B60L 50/61* (2019.02); *B60L 58/16* (2019.02); *G01R 31/392* (2019.01)

(58) Field of Classification Search
CPC ........ B60L 58/13; B60L 58/16; B60L 3/0046; B60L 50/61; G01R 31/392
USPC .......................................................... 320/132
See application file for complete search history.

(56) References Cited

U.S. PATENT DOCUMENTS

| | | | | |
|---|---|---|---|---|
| 9,744,874 | B2* | 8/2017 | Obata etal. | .......... B60L 11/1862 |
| 9,947,974 | B2* | 4/2018 | Minamiura | .......... H01M 10/486 |
| 10,137,880 | B2* | 11/2018 | Ogawa et al. | ........ B60W 10/06 |
| 10,676,078 | B2* | 6/2020 | Amaike | ................ B60W 50/10 |
| 2010/0131139 | A1* | 5/2010 | Sakai et al. | ........... B60W 10/08 |
| | | | | 701/22 |

(Continued)

FOREIGN PATENT DOCUMENTS

JP    2016-182022 A    10/2016

*Primary Examiner* — Sun J Lin
(74) *Attorney, Agent, or Firm* — Dinsmore & Shohl LLP

(57) ABSTRACT

A hybrid vehicle includes an engine, a motor generator, a battery, and an ECU (Electronic Control Unit). The ECU is configured to calculate an evaluation value indicating a degree of progress of deterioration of the battery, the deterioration being caused by an imbalance in a salt concentration in the battery, and is configured to execute a high-rate deterioration suppressing control that raises a target SOC (State of Charge) of the battery when the battery is evaluated to be deteriorated in accordance with the evaluation value. The ECU is configured to also raise the target SOC when an actual SOC is increased due to an electric power generation by the motor generator during the execution of the high-rate deterioration suppressing control. The raised target SOC is lower than the increased actual SOC.

8 Claims, 14 Drawing Sheets

(56) References Cited

U.S. PATENT DOCUMENTS

2016/0280093 A1     9/2016  Obata et al.
2018/0134274 A1*    5/2018  Ogawa .................. B60W 10/08

* cited by examiner

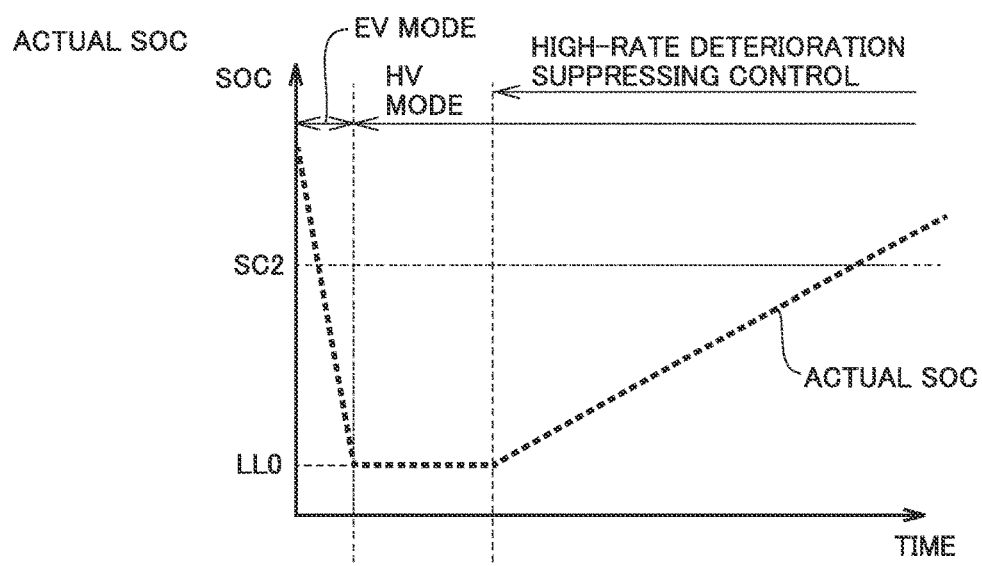
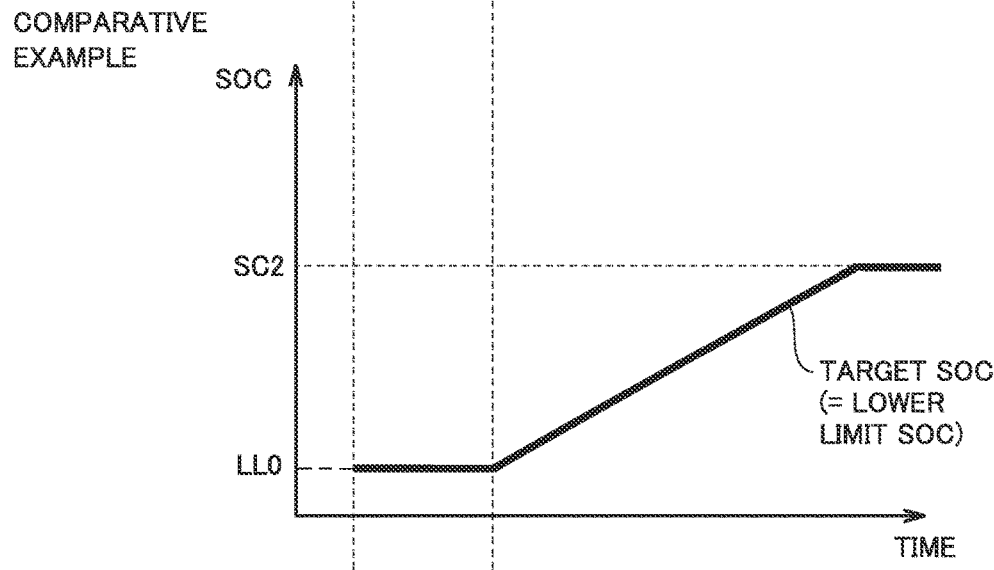
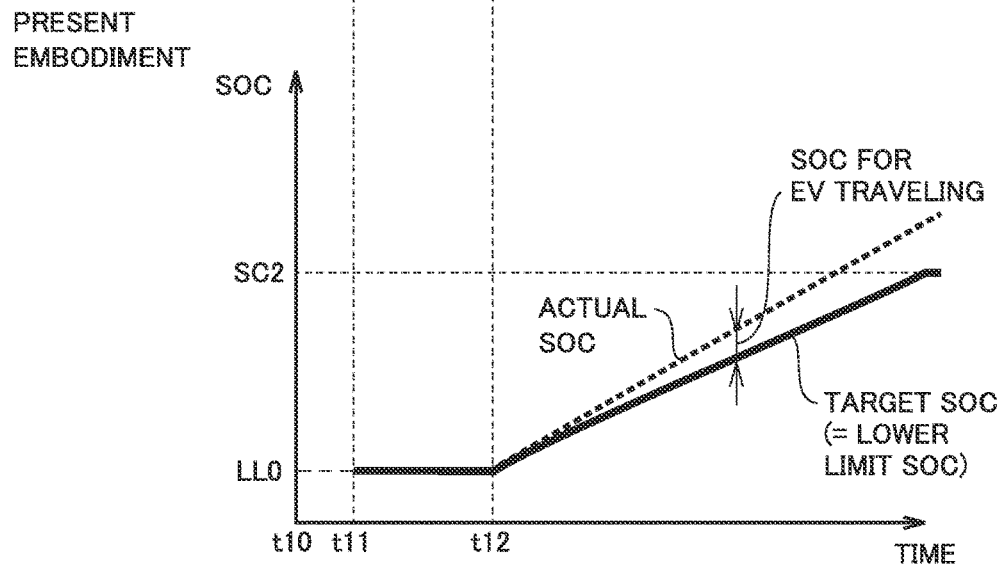

FIG.7
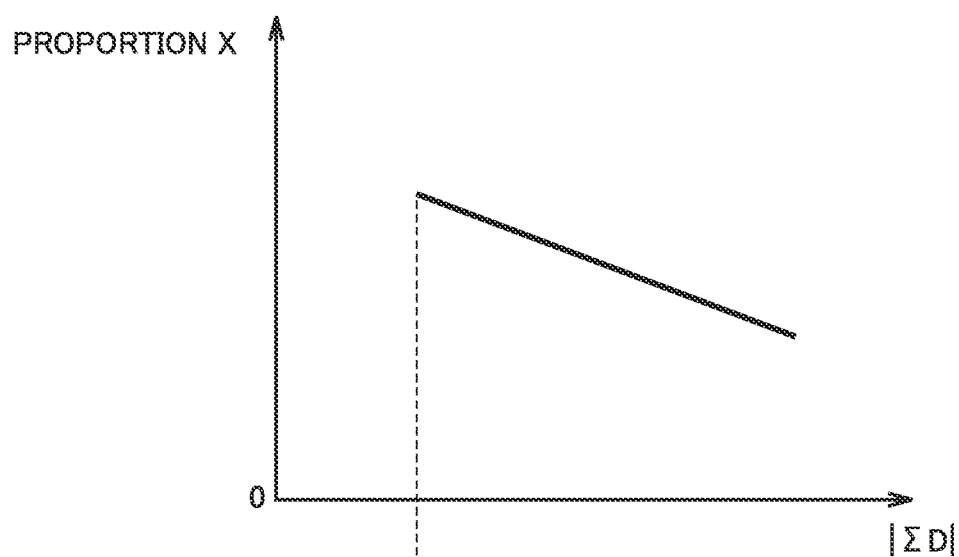
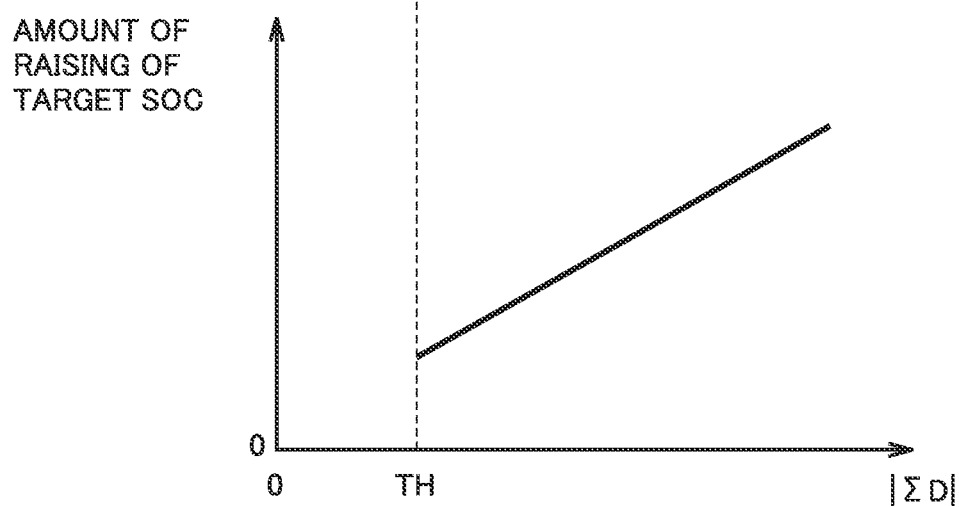

FIG.15 <MODIFICATION 2>
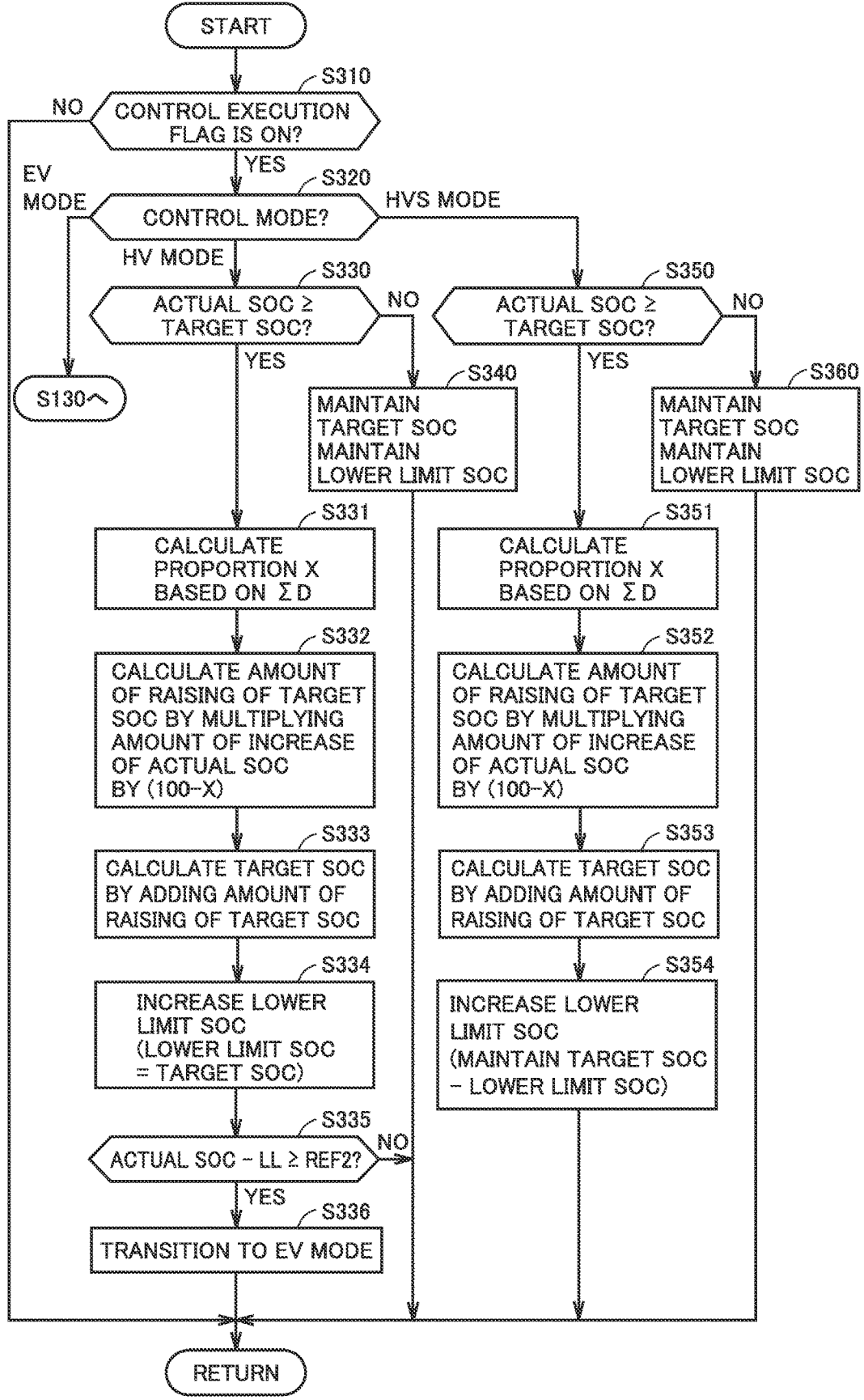

HYBRID VEHICLE AND METHOD FOR CONTROLLING SAME

CROSS REFERENCE TO RELATED APPLICATIONS

This nonprovisional application claims priority to Japanese Patent Application 2018-047080 filed on Mar. 14, 2018 with the Japan Patent Office, the entire contents of which are hereby incorporated by reference.

BACKGROUND

Field

The present disclosure relates to a hybrid vehicle and a method for controlling the hybrid vehicle, more particularly, a control technique for suppressing high-rate deterioration occurring in a secondary battery mounted on a hybrid vehicle.

Description of the Background Art

When there occurs an imbalance in a salt concentration distribution in an electrode assembly of a secondary battery as a result of charging and discharging of the secondary battery, internal resistance of the secondary battery is increased. Such increased internal resistance resulting from the imbalance in the salt concentration distribution is referred to as "high-rate deterioration" in order to distinguish from aged deterioration of a material of the secondary battery.

Generally, in a region with a low SOC (State Of Charge) of the secondary battery, expansion and contraction of a negative electrode become larger than those in a region with a high SOC, with the result that an electrolyte solution is likely to flow in the electrode assembly. Accordingly, a salt concentration difference is likely to occur in the electrode assembly, with the result that the high-rate deterioration may be promoted.

Japanese Patent Laying-Open No. 2016-182022 discloses control for (i) calculating an evaluation value indicating a degree of progress of the high-rate deterioration, and (ii) raising a control target (hereinafter, also referred to as "target SOC") of the SOC of the secondary battery when the evaluation value becomes more than a predetermined threshold value. According to this control, the high-rate deterioration is suppressed because an actual SOC of the secondary battery is increased to follow the target SOC to avoid charging and discharging of the secondary battery in the low SOC region. In the description below, such control for suppressing the high-rate deterioration of the secondary battery by raising the target SOC of the secondary battery is also referred to as "high-rate deterioration suppressing control" (or may be simply referred to as "deterioration suppressing control").

SUMMARY

An exemplary and conceivable situation that may occur during execution of the high-rate deterioration suppressing control is as follows: the actual SOC is increased to be more than the target SOC because the hybrid vehicle travels down a long hill. The present inventors paid attention to such a fact that the following problem may occur under such a situation.

When downhill traveling is continued, a user considers that a sufficient amount of electric power has been recovered to the secondary battery as a result of regenerative power generation by a motor, and expects that EV traveling (traveling only by the motor with the engine being non-operational) will be performed to a certain extent also after the downhill traveling is ended.

However, when the high-rate deterioration suppressing control is executed, a difference between the actual SOC and the target SOC in the secondary battery becomes smaller, by the amount of raising of the target SOC, than that when the high-rate deterioration suppressing control is not executed. For example, in the case where the target SOC is raised to follow the actual SOC increased by the downhill traveling, when the actual SOC is decreased after the downhill traveling is ended, the actual SOC immediately becomes less than the target SOC, with the result that the engine is operated to charge the secondary battery. Accordingly, the user may have such a strange feeling that the engine is operated with the EV traveling being hardly performed irrespective of such a fact that the regenerative power generation has been performed as a result of the downhill traveling.

The present disclosure has been made to solve the above-described problem, and has an object to suppress occurrence of a strange feeling due to execution of high-rate deterioration suppressing control in a hybrid vehicle having a secondary battery mounted thereon.

(1) A hybrid vehicle according to a certain aspect of the present disclosure includes: an engine, a motor, a secondary battery, and a controller. The motor is configured to generate vehicle driving power by consuming electric power, and is configured to perform electric power generation with the engine being operated and perform regenerative power generation involved in traveling of the hybrid vehicle. The secondary battery is configured to exchange electric power with the motor. The controller is configured to calculate an evaluation value indicating a degree of progress of deterioration of the secondary battery, the deterioration being caused by an imbalance in a salt concentration in the secondary battery, the controller being configured to execute deterioration suppressing control that raises a target SOC of the secondary battery when the secondary battery is evaluated to be deteriorated in accordance with the evaluation value. The controller is configured to also raise the target SOC when an actual SOC of the secondary battery is increased due to the electric power generation by the motor during the execution of the deterioration suppressing control. The raised target SOC is lower than the increased actual SOC.

(2) The controller is configured to calculate the actual SOC and the target SOC in each predetermined calculation cycle during the execution of the deterioration suppressing control. In each calculation cycle, an amount of raising of the target SOC is smaller than an amount of increase of the actual SOC.

(3) The controller is configured to employ, as the amount of raising of the target SOC, a value obtained by correcting the amount of increase of the actual SOC in a present calculation cycle by a coefficient. The controller is configured to calculate the target SOC in the present calculation cycle by adding the amount of raising of the target SOC to the target SOC in a previous calculation cycle.

According to the configuration of each of (1) to (3), the target SOC is raised when the actual SOC is increased due to the electric power generation by the motor during the execution of the deterioration suppressing control. The raised target SOC is lower than the increased actual SOC. This can be realized by setting, in each calculation cycle, the amount of raising of the target SOC to be smaller than the amount of increase of the actual SOC resulting from the electric power generation by the motor. For example, the value obtained by correcting, by the coefficient, the amount of increase of the SOC resulting from the electric power generation by the motor (for example, a value obtained by multiplying a proportion of less than 1) can be calculated as the amount of raising of the target SOC. In this way, at least a SOC (or electric power amount) corresponding to a difference between the target SOC and the actual SOC increased by the electric power generation by the motor can be secured for the EV traveling of the hybrid vehicle. Accordingly, it is possible to suppress occurrence of such a strange feeling that the EV traveling has been hardly performed irrespective of such a fact that the motor has generated electric power.

(4) The controller is configured to set the coefficient to increase the amount of raising of the target SOC as the secondary battery is evaluated to be more progressed in deterioration in accordance with the evaluation value.

According to the configuration of (4), for example, when the absolute value of the evaluation value is large and it is evaluated that the high-rate deterioration of the secondary battery has been progressed, the coefficient is set in view of such an assumption that the target SOC highly needs to be increased (for example, the above-described proportion of less than 1 is set to be high). By thus increasing the amount of raising of the target SOC as the high-rate deterioration is more progressed, the high-rate deterioration can be preferentially suppressed. On the other hand, when the high-rate deterioration has not been progressed much, the coefficient is adjusted to set the target SOC to be relatively low, whereby the EV traveling can be preferentially secured.

(5) The controller is configured to select one of a plurality of control modes including an EV mode and an HV mode. The EV mode is a mode in which an amount of electric power stored in the secondary battery is consumed. The HV mode is a mode in which when the actual SOC is decreased to a threshold value during the EV mode, the target SOC is adjusted to maintain the actual SOC at the threshold value. During the HV mode and the execution of the deterioration suppressing control, the controller is configured to raise the threshold value together with the target SOC when the actual SOC is increased due to the electric power generation by the motor.

According to the configuration of (5), in the case where the deterioration suppressing control is executed in the HV mode, when the actual SOC is increased due to the electric power generation by the motor, the threshold value is raised in addition to the target SOC. Accordingly, even when the control mode is then switched from the HV mode to the EV mode, a SOC (or electric power amount) corresponding to a difference between the raised threshold value and the actual SOC increased by the electric power generation by the motor is secured for the EV traveling in the EV mode. Accordingly, even when the control mode is switched to the EV mode, it is possible to suppress occurrence of such a strange feeling that the EV traveling distance has become short.

(6) The hybrid vehicle is configured to permit external charging for charging the secondary battery using electric power supplied from outside of the hybrid vehicle. During the external charging, the controller is configured to maintain the threshold value at a value obtained at a time of starting to perform the external charging.

According to the configuration of (6), the threshold value is maintained even though the SOC is increased due to the external charging. By maintaining the threshold value, a SOC (or electric power amount) corresponding to a difference between the threshold value and the actual SOC increased due to the external charging is secured for the EV traveling in the EV mode. Accordingly, it is possible to suppress occurrence of such a strange feeling that the EV traveling distance has not been recovered irrespective of such a fact that the external charging has been performed.

(7) The plurality of control modes further include an HVS mode in which the target SOC is adjusted in accordance with a user's request so as to maintain the actual SOC to be higher than the threshold value. During the HVS mode and the execution of the deterioration suppressing control, the controller is configured to raise both the target SOC and the threshold value while maintaining a difference between the target SOC and the threshold value, when the actual SOC is increased due to the electric power generation by the motor.

According to the configuration of (7), both the target SOC and the threshold value can be raised when the deterioration suppressing control is performed in the HVS mode. By also raising the threshold value in this way, the SOC is not decreased too much even when the control mode is then switched from the HVS mode to the EV mode, whereby the high-rate deterioration can be suppressed. Moreover, the HVS mode is a control mode started by the user's operation, and when raising the target SOC and the threshold value, the difference between the target SOC and the threshold value at the time of the user's operation is maintained so as not to raise the threshold value too much, for example. Accordingly, the EV traveling distance at the time of the user's operation can be secured, so that when the control mode is then switched to the EV mode, the user can be suppressed from having the strange feeling.

(8) In a method for controlling a hybrid vehicle according to another aspect of the present disclosure, the hybrid vehicle includes: an engine; a motor configured to generate vehicle driving power by consuming electric power, the motor being configured to perform electric power generation with the engine being operated and perform regenerative power generation involved in traveling of the hybrid vehicle; and a secondary battery configured to exchange electric power with the motor. The method includes: calculating an evaluation value indicating a degree of progress of deterioration of the secondary battery, the deterioration being caused by an imbalance in a salt concentration in the secondary battery; and executing deterioration suppressing control that raises a target SOC of the secondary battery when the secondary battery is evaluated to be deteriorated in accordance with the evaluation value. The target SOC is also raised when an actual SOC of the secondary battery is increased due to the electric power generation by the motor during the execution of the deterioration suppressing control. The raised target SOC is lower than the increased actual SOC.

According to the method of (8), as with the configuration of (1), it is possible to suppress occurrence of such a strange feeling that the EV travel has been hardly performed irrespective of such a fact that the motor has generated electric power.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 5A is a time chart for illustrating the raising of the target SOC in the present embodiment.

FIG. 5B is a time chart for illustrating the raising of the target SOC in the present embodiment.

FIG. 5C is a time chart for illustrating the raising of the target SOC in the present embodiment.

FIG. 7 illustrates a relation between an evaluation value and a proportion X.

FIG. 15 is a flowchart showing an exemplary process procedure of each of high-rate deterioration suppressing control and a control mode switching process associated therewith in a modification 2 of the embodiment.

DETAILED DESCRIPTION

Figure 1:
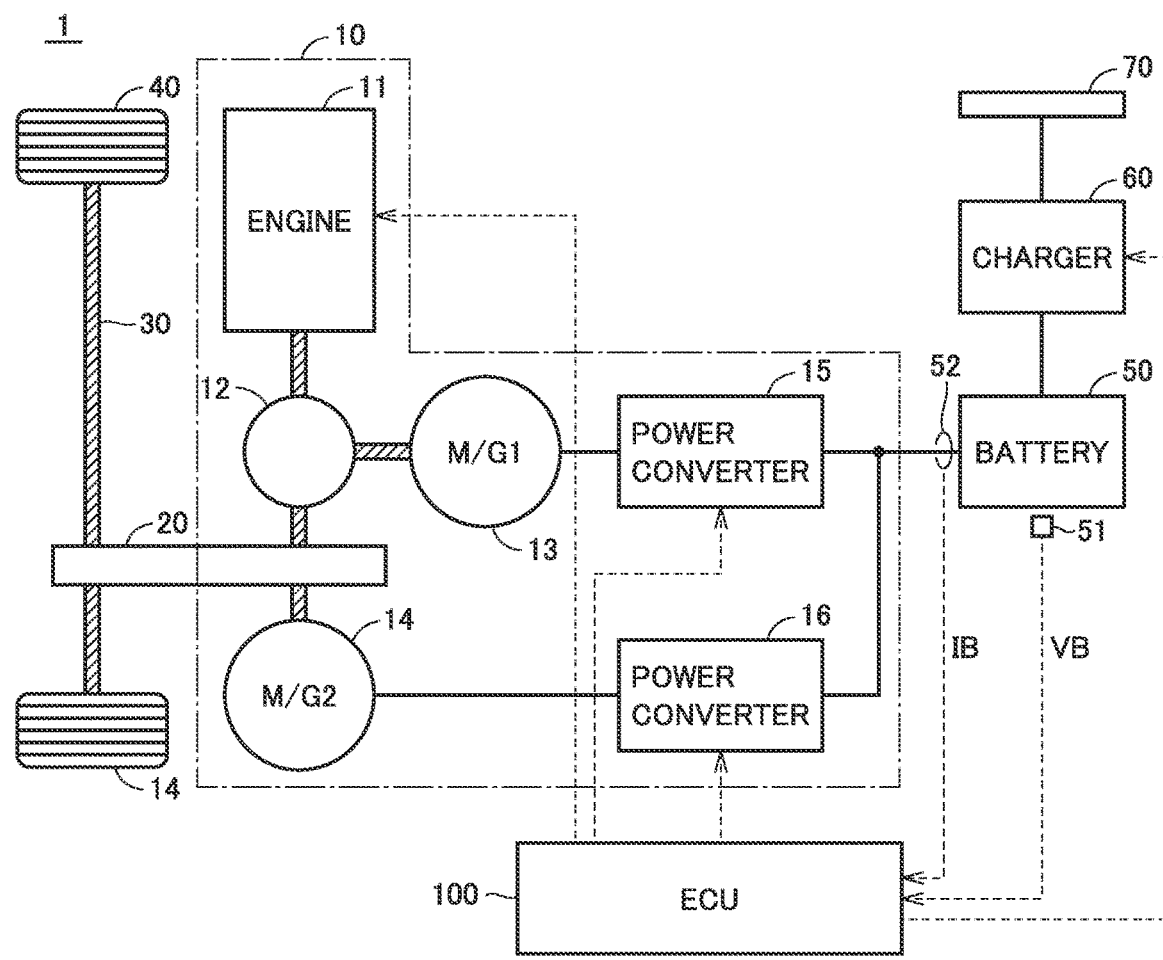
FIG. 1 is a block diagram showing an entire configuration of a hybrid vehicle according to an embodiment of the present disclosure.

The following describes an embodiment of the present disclosure with reference to figures in detail. It should be noted that the same or corresponding portions in the figures are given the same reference characters and are not described repeatedly.

Embodiment

<Vehicle Configuration>

FIG. 1 is a block diagram showing an entire configuration of a hybrid vehicle according to an embodiment of the present disclosure. With reference to FIG. 1, a vehicle 1 is a plug-in hybrid vehicle, and includes a vehicle driving device 10, a transmission gear 20, a drive shaft 30, a wheel 40, a battery 50, a charger 60, an inlet 70, and an ECU (Electronic Control Unit) 100. It should be noted that vehicle 1 does not need to be a plug-in hybrid vehicle and may be an ordinary hybrid vehicle (a vehicle that is not configured to permit external charging (described below)).

Vehicle driving device 10 is configured to generate vehicle driving power and generate electric power. Specifically, vehicle driving device 10 includes an engine 11, a power split device 12, motor generators 13, 14, and power converters 15, 16.

Engine 11 is an internal combustion engine for outputting motive power by converting thermal energy resulting from combustion of fuel into kinetic energy of a kinetic element such as a piston or a rotor.

Power split device 12 includes a planetary gear mechanism (not shown) having three rotation shafts of a sun gear, a carrier, and a ring gear, for example. Power split device 12 splits the driving power of engine 11 into motive power to be transmitted to the rotation shaft of motor generator 13 and motive power to be transmitted to transmission gear 20. Transmission gear 20 is coupled to drive shaft 30 for driving wheel 40. Moreover, transmission gear 20 is also coupled to the rotation shaft of motor generator 14.

Each of motor generators 13, 14 is an AC rotating electrical machine, such as a three-phase AC synchronous motor including a rotor having a permanent magnet embedded therein. Motor generator 13 is used as a power generator driven by engine 11 via power split device 12, and is used also as a motor for starting engine 11. Motor generator 14 is operated mainly as a motor, and drives drive shaft 30. On the other hand, during braking or downhill traveling of the vehicle, motor generator 14 operates as a power generator to perform regenerative power generation.

It should be noted that both motor generators 13, 14 correspond to a "motor" according to the present disclosure. However, the "motor" according to the present disclosure may be constituted of only one motor depending on a configuration of the hybrid vehicle.

Power converter 15 performs bidirectional DC/AC power conversion between motor generator 13 and battery 50 based on a control signal received from ECU 100. Likewise, power converter 16 performs bidirectional DC/AC power conversion between motor generator 14 and battery 50 based on a control signal received from ECU 100. Accordingly, as a result of exchange of electric power with battery 50, motor generators 13, 14 can output positive torque for operating as a motor or negative torque for operating as a power generator. Each of power converters 15, 16 is constituted of an inverter (not shown), for example. It should be noted that a boosting converter (not shown) for DC voltage conversion may be disposed between battery 50 and each of power converters 15, 16.

Battery 50 is a rechargeable secondary battery, such as a nickel-metal hydride battery or a lithium ion battery. Battery 50 supplies electric power to power converters 15, 16. Moreover, battery 50 is charged by receiving generated electric power during electric power generation by motor generator 13 and/or motor generator 14. Furthermore, battery 50 can be charged by receiving electric power supplied via inlet 70 from a power supply (not shown) external to the vehicle.

A voltage sensor 51 and a current sensor 52 are provided at battery 50. Voltage sensor 51 detects a voltage VB of battery 50, and outputs a detection value thereof to ECU 100. Current sensor 52 detects a current IB sent to/from battery 50, and sends a detection value thereof to ECU 100. It should be noted that current IB has a positive value upon outputting (discharging) from battery 50, and has a negative value upon inputting (charging) to battery 50. A remaining capacity of battery 50 is represented by a SOC, which indicates, in percentage, a ratio of a present amount of stored electric power to a fully charged state of battery 50. The SOC (actual SOC) is calculated based on the detection value(s) of voltage sensor 51 and/or current sensor 52, for example.

Charger 60 converts electric power, supplied from the power supply (not shown) external to the vehicle and electrically connected to inlet 70, to a voltage level of battery 50, and then outputs it to battery 50. In the present specification, the charging of battery 50 using the electric power supplied from the power supply (external power supply) external to the vehicle will be also referred to as "external charging". Charger 60 includes a rectifier or an inverter, for example. It should be noted that a manner of receiving electric power from the external power supply is not limited to the contact power reception using inlet 70. Electric power may be received contactlessly from the external power supply using a power receiving coil or the like instead of inlet 70.

ECU 100 includes a CPU (Central Processing Unit), a storage device, an input/output port, and the like (all not shown), and is configured to control each device in vehicle 1. It should be noted that the above-described control is not limited to the process by software, but can be carried out by dedicated hardware (an electronic circuit).

Examples of main control by ECU 100 include calculation of vehicle driving torque, vehicle driving power, and requested charging power. More specifically, ECU 100 calculates the vehicle driving torque (requested value) based on vehicle speed and an accelerator position according to an operation amount of the accelerator pedal, and calculates the vehicle driving power (requested value) based on the calculated vehicle driving torque. Moreover, ECU 100 calculates the requested charging power for battery 50 based on the SOC of battery 50 and controls vehicle driving device 10 to generate power (hereinafter, referred to as "vehicle power") obtained by adding the requested charging power to the vehicle driving power.

When the vehicle power is small, ECU 100 controls vehicle driving device 10 to travel using only motor generator 14 with engine 11 being non-operational (EV traveling). Accordingly, battery 50 discharges to decrease the actual SOC. When the vehicle power becomes large, ECU 100 controls vehicle driving device 10 to travel with engine 11 being operated (HV traveling). On this occasion, battery 50 is charged when the output of engine 11 is larger than the vehicle power, and battery 50 discharges when the vehicle power is larger than the engine output.

ECU 100 controls traveling of vehicle 1 by selectively applying the following modes: a mode (EV mode) in which the actual SOC is actively consumed by mainly performing the EV traveling while permitting the HV traveling; and a mode in which the actual SOC is maintained by appropriately switching between the HV traveling and the EV traveling. The latter mode includes an HV mode and an HVS mode. Each mode will be described in detail later.

Moreover, during the external charging, ECU 100 controls charger 60 to convert electric power, supplied from the external power supply electrically connected to inlet 70, to the voltage level of battery 50, and to output it to battery 50.

Further, ECU 100 calculates an evaluation value ΣD indicating a degree of progress of deterioration (high-rate deterioration) of battery 50. The deterioration is caused by a continuous imbalance in a salt concentration of battery 50 due to charging and discharging of battery 50. Although a method for calculating evaluation value ΣD will be described in detail later, this evaluation value ΣD indicates a negative value when the imbalance occurs in the salt concentration due to battery 50 being used to be charged excessively, and indicates a positive value when the imbalance occurs in the salt concentration due to battery 50 being used to discharge excessively.

The high-rate deterioration has such characteristics that the high-rate deterioration is promoted when the battery is used in a region with a low SOC. This is presumably due to the following reason: since expansion and contraction of a negative electrode become large in the region with a low SOC, an electrolyte solution in the electrode assembly is likely to be pushed, with the result that a difference in the salt concentration is likely to be caused in the electrode assembly. Moreover, generally, the high-rate deterioration is particularly promoted when the secondary battery is used to be excessively charged in the low SOC region. Hence, in the description below, it is assumed that evaluation value ΣD is a negative value. In the present embodiment, when the high-rate deterioration is evaluated to be progressed in accordance with evaluation value ΣD, the target SOC is raised to increase the actual SOC. Such SOC control is also referred to as "high-rate deterioration suppressing control". Hereinafter, the high-rate deterioration suppressing control will be described in detail.

<High-Rate Deterioration Suppressing Control>

Figure 2:
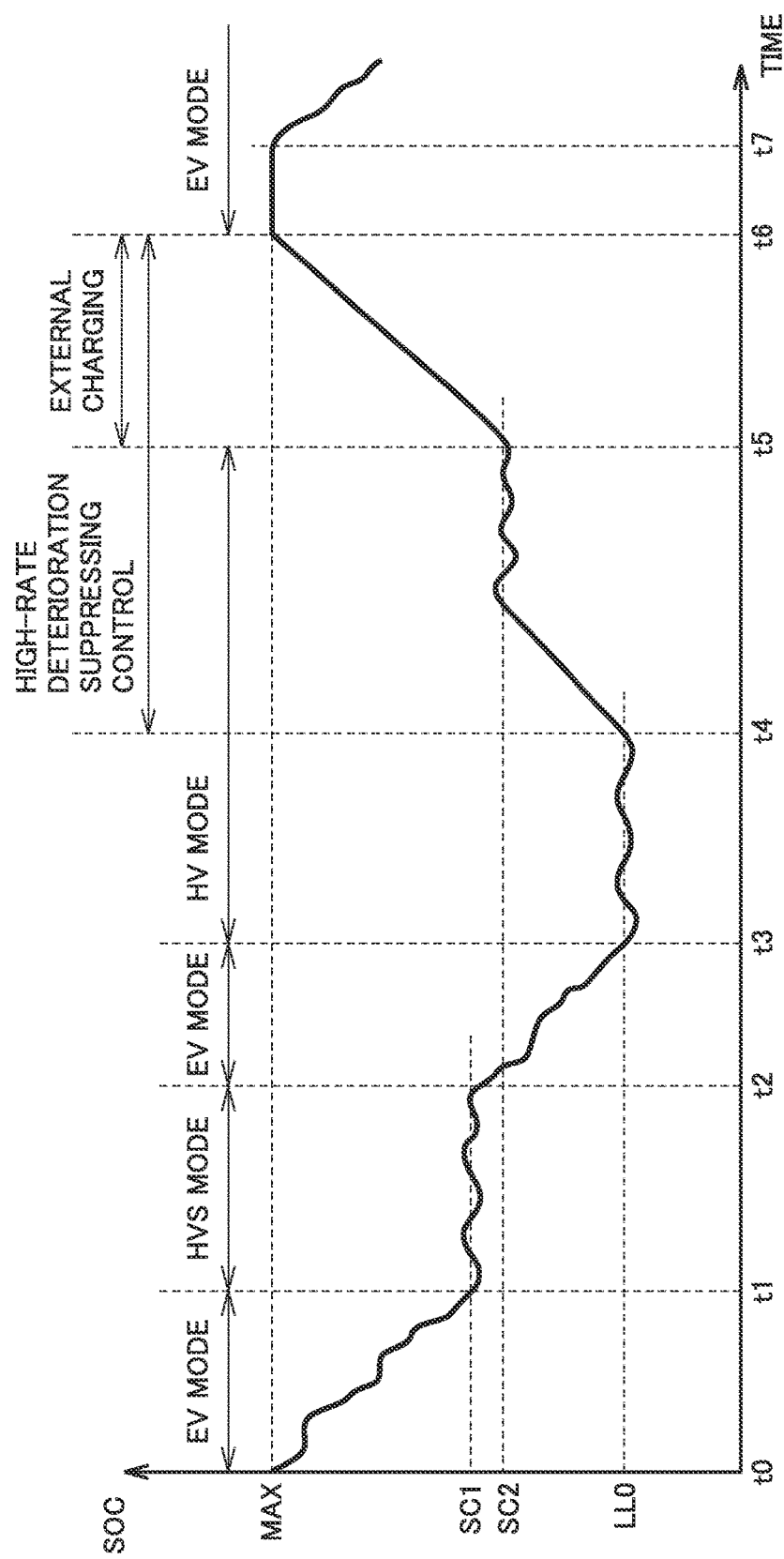
FIG. 2 shows an exemplary change in a SOC of a battery.

FIG. 2 shows an exemplary change in the SOC of battery 50. In FIG. 2, the horizontal axis represents elapsed time whereas the vertical axis represents the SOC (actual SOC) of battery 50. With reference to FIG. 2, it is assumed that traveling in the EV mode is started at a time t0 after battery 50 is brought into the fully charged state (SOC=MAX) as a result of the external charging.

The EV mode is a mode in which the actual SOC is actively consumed. Basically, in the EV mode, the electric power (electric energy mainly obtained by the external charging) stored in battery 50 is consumed. During the traveling in the EV mode, engine 11 is not operated in order to maintain the actual SOC. Specifically, for example, during the EV mode, the requested charging power of battery 50 is set to 0 (zero). Accordingly, although the actual SOC may be increased temporarily due to regenerative power recovered upon deceleration of the vehicle or electric power generated by the operation of engine 11, a proportion of discharging consequently becomes larger than a proportion of charging, with the result that the actual SOC is decreased as a whole as a traveling distance is increased.

Even in the EV mode, when the vehicle power (vehicle driving power) becomes more than an engine start threshold value, engine 11 is operated. Moreover, even when the vehicle power is not more than the engine start threshold value, an operation of engine 11 may be permitted for warming-up of engine 11 or an exhaust catalyst or the like. That is, also in the EV mode, the EV traveling and the HV traveling can be performed. It should be noted that such an EV mode may be also referred to as "CD (Charge Depleting) mode".

When the actual SOC is decreased at a time t3 to a lower limit value LL0 serving as a lower limit SOC, the control mode is switched from the EV mode to the HV mode (the HVS mode during a period of time t1 to a time t2 will be described later). The HV mode is a mode in which the target SOC is adjusted to maintain the actual SOC at the lower limit SOC set as lower limit value LL0 in FIG. 2. Specifically, when the actual SOC is decreased to be lower than lower limit value LL0, engine 11 is operated to maintain the actual SOC (HV traveling). When the actual SOC is increased, engine 11 becomes non-operational (EV traveling). Thus, the lower limit SOC is a control start threshold value for the EV mode, and corresponds to a "threshold value" according to the present disclosure.

It should be noted that also in the HV mode, when the actual SOC becomes high, engine 11 becomes non-operational. That is, the HV mode is not limited to the HV traveling in which engine 11 is always operated for traveling. Also in the HV mode, the EV traveling and the HV traveling can be performed.

The HVS mode is a mode in which the target SOC is adjusted in accordance with a user's request (user's operation) so as to maintain the actual SOC to be higher than the lower limit SOC (here, lower limit value LL0). In this example, the user's request is made at time t1, and the actual SOC is controlled (maintained) to be at a value SC1 (SC1> LL0) obtained at the time of the user's request, until time t2 at which the request is canceled. It should be noted that the request and cancellation for transition to the HVS mode are input via an operation button or switch (not shown) that can be operated by the user, for example.

In the HVS mode, when the actual SOC is decreased to be lower than value SC1, engine 11 is operated (HV traveling). When the actual SOC is increased, engine 11 becomes non-operational (EV traveling). That is, also in the HVS mode, engine 11 is operated to maintain the actual SOC; however, as with the HV mode, when the actual SOC becomes high, engine 11 becomes non-operational. It should be noted that the HV mode and the HVS mode each for maintaining the actual SOC may be collectively referred to as "CS (Charge Sustaining) mode".

In each of the HV mode and the HVS mode, the requested charging power of battery 50 is calculated based on the actual SOC. For example, the requested charging/discharging power of battery 50 is determined based on a deviation between the actual SOC and the target SOC (lower limit value LL0 in the HV mode and value SC1 in the HVS mode). Then, vehicle driving device 10 is controlled to generate the power (vehicle power) obtained by adding the requested charging power to the vehicle driving power. Accordingly, in the HV mode, the actual SOC is controlled to be around lower limit value LL0, whereas in the HVS mode, the actual SOC is controlled to be around predetermined value SC1.

While the HV mode is selected, when it is evaluated at a time t4 shown in FIG. 2 in accordance with evaluation value ΣD for the high-rate deterioration that the high-rate deterioration has been progressed, the high-rate deterioration suppressing control is executed to increase the target SOC from lower limit value LL0 to a predetermined value SC2 (SC2> LL0). It should be noted that as one example, lower limit value LL0 is set as SOC= about 20%, whereas predetermined value SC2 is set as SOC=about 50%.

Figure 3:
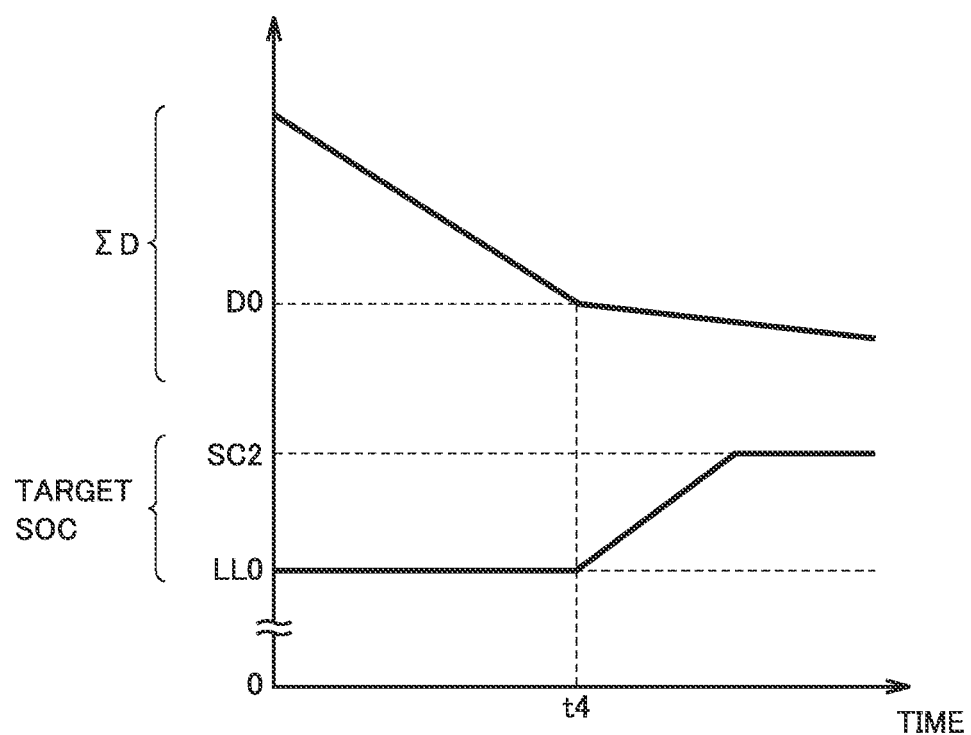
FIG. 3 shows an exemplary relation between an evaluation value for high-rate deterioration and a SOC target.

FIG. 3 shows an exemplary relation between evaluation value ΣD for the high-rate deterioration and the target SOC. With reference to FIG. 3, evaluation value ΣD is increased as a negative value while the HV mode is selected. When evaluation value ΣD reaches a criteria value D0 (<0) at time t4, the target SOC is raised from lower limit value LL0 to predetermined value SC2.

During the traveling in the HV mode, the target SOC can be higher than the actual SOC of battery 50. When the target SOC is higher than the actual SOC, the target SOC is maintained, whereas when the actual SOC is increased to reach the target SOC due to the electric power generation being performed with engine 11 being operated or the like, the target SOC is raised by a predetermined amount (amount sufficiently smaller than a difference between SC2 and LL0) (details will be described later). Accordingly, the target SOC is gradually (stepwisely when viewed microscopically) raised toward SC2. It should be noted that although the actual SOC and the target SOC may be fluctuated as shown in FIG. 2, such a temporal fluctuation is not shown in figures in order to facilitate understanding in the description below.

With reference to FIG. 2 again, the external charging is started at a time t5 to increase the actual SOC. When battery 50 reaches the fully charged state (SOC=MAX) at a time t6, the external charging is ended. Accordingly, the high-rate deterioration suppressing control is not executed, and the EV mode is selected.

<Raising of Target SOC>

FIG. 3 illustrates a typical traveling situation of vehicle 1 in which the actual SOC and the target SOC coincides with each other. The following assumes a situation in which vehicle 1 during the execution of the high-rate deterioration suppressing control travels down a long hill.

When vehicle 1 performs downhill traveling for a long time, battery 50 is charged by regenerative power generation by motor generator 14, with the result that the actual SOC can become much larger than the target SOC. The user considers that a sufficient amount of electric power has been recovered as a result of the regenerative power generation during the long downhill traveling, and expects that the EV traveling will be performed to a certain extent after the downhill traveling is ended. However, the target SOC has been raised in the high-rate deterioration suppressing control. Therefore, a difference between the actual SOC and the target SOC is smaller, by the amount of raising of the target SOC, than that when the high-rate deterioration suppressing control is not executed.

Figure 4A:
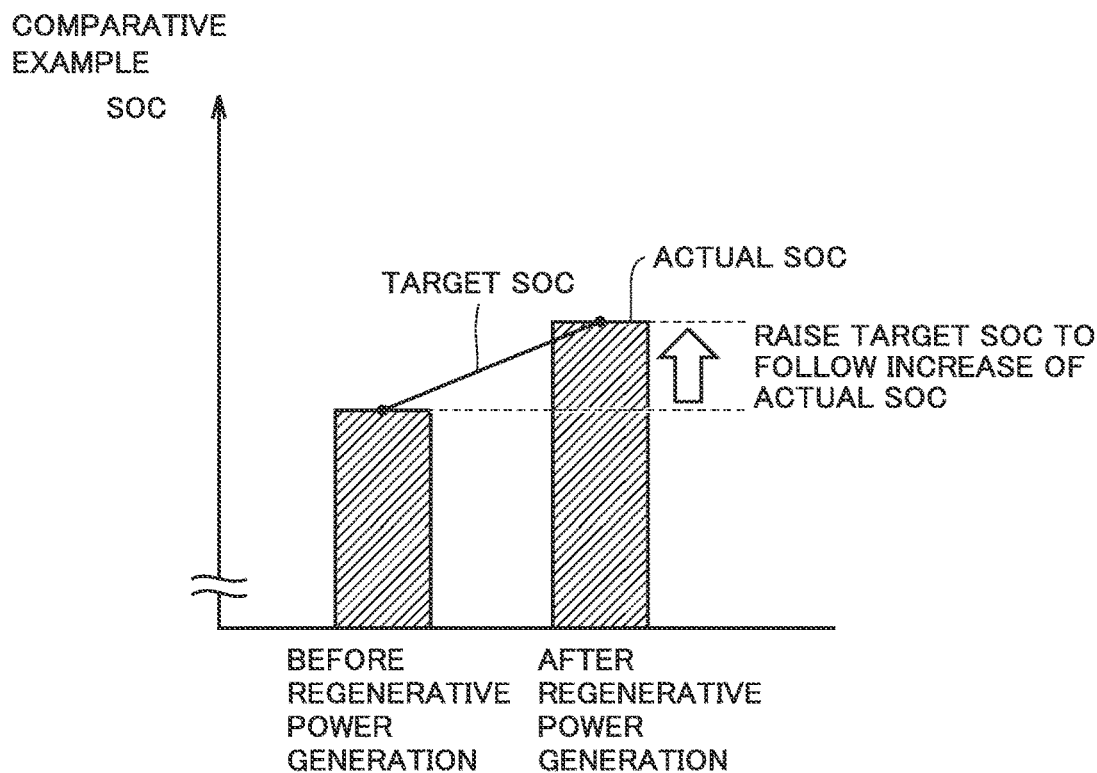
FIG. 4A is a conceptual view for illustrating raising of the target SOC.
Figure 4B:
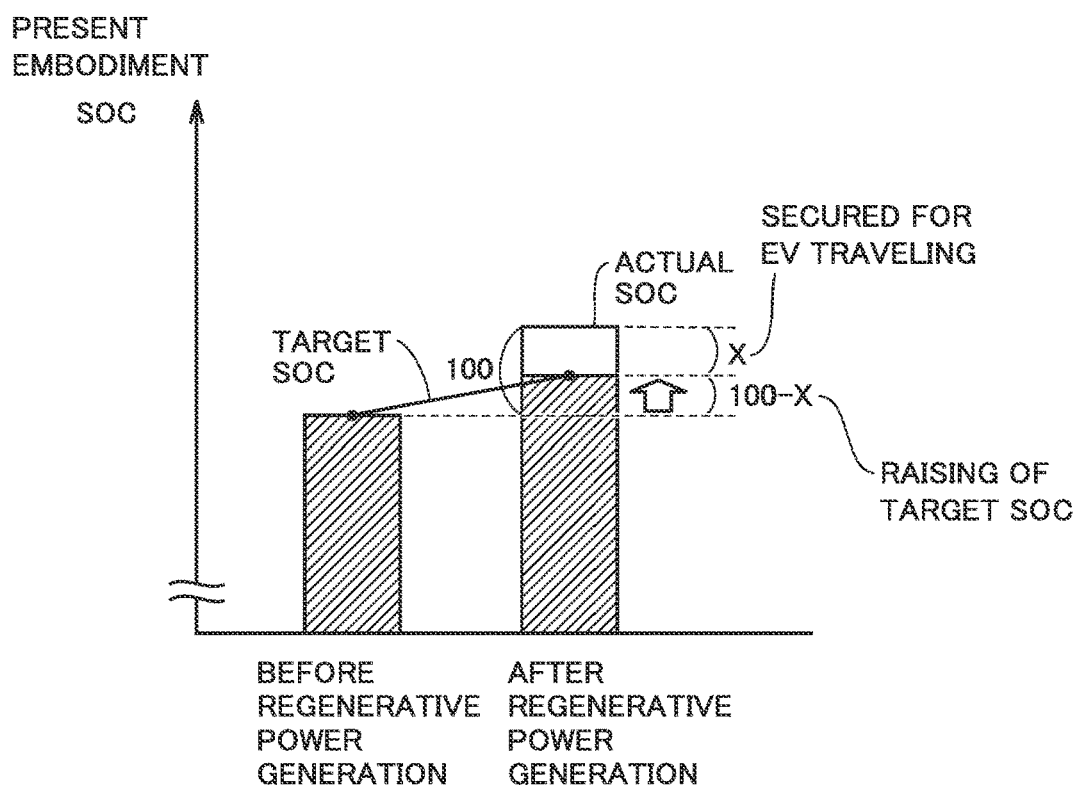
FIG. 4B is a conceptual view for illustrating raising of the target SOC

Each of FIG. 4A and FIG. 4B is a conceptual view for illustrating the raising of the target SOC. In each of FIG. 4A and FIG. 4B, a bar graph represents a change in the actual SOC, and a line graph represents a change in the target SOC.

As shown in FIG. 4A for a comparative example, it is also considered to raise the target SOC so as to follow the actual SOC having been increased due to the regenerative power generation during the downhill traveling. However, in this case, when the actual SOC is decreased after the end of the downhill traveling, the actual SOC is decreased immediately to be less than the target SOC, with the result that engine 11 is operated. As a result, the user may have such a strange feeling that engine 11 is operated and the EV traveling is hardly performed irrespective of such a fact that the regenerative power generation has been performed as a result of the downhill traveling.

To address this, in the present embodiment, the following configuration is employed: when the actual SOC is increased after starting execution of the high-rate deterioration suppressing control, part of the amount of increase of the actual SOC after starting the execution is not reflected in the raising of the target SOC and is secured for the EV traveling as shown in FIG. 4B. More specifically, a predetermined proportion X [unit: %] of the amount of increase of the actual SOC is secured for the EV traveling, and the target SOC is raised by a remaining proportion (100–X). It should be noted that proportion (100–X) corresponds to one example of a "coefficient" according to the present disclosure.

Each of FIG. 5A to FIG. 5C is a time chart for illustrating the raising of the target SOC in the present embodiment. FIG. 5A shows an exemplary temporal change of the actual SOC. It is assumed that the EV mode has been selected during a period from a certain time t10 to a time t11. The actual SOC reaches lower limit value LL0 at time t11, and the control mode is switched from the EV mode to the HV mode. Then, the high-rate deterioration suppressing control is started at a time t12.

FIG. 5B shows a temporal change of the target SOC in the comparative example. In this comparative example, the target SOC is raised so as to follow the increase of the actual SOC.

On the other hand, in the present embodiment, as shown in FIG. 5C, the raising of the target SOC in response to the increase of the actual SOC is lowered as compared with the comparative example. More specifically, the actual SOC and the target SOC are calculated in each predetermined calculation cycle (for example, 100 milliseconds; hereinafter, simply referred to as "cycle"). The amount of raising of the target SOC is set to a value smaller than the amount of increase of the actual SOC by a value obtained by multiplying the amount of increase of the actual SOC by proportion X. As such, proportion X of the amount of increase of the actual SOC in each cycle is first secured for the EV traveling, and the target SOC is raised by the remaining proportion (100−X).

<Functional Block>

Figure 6:
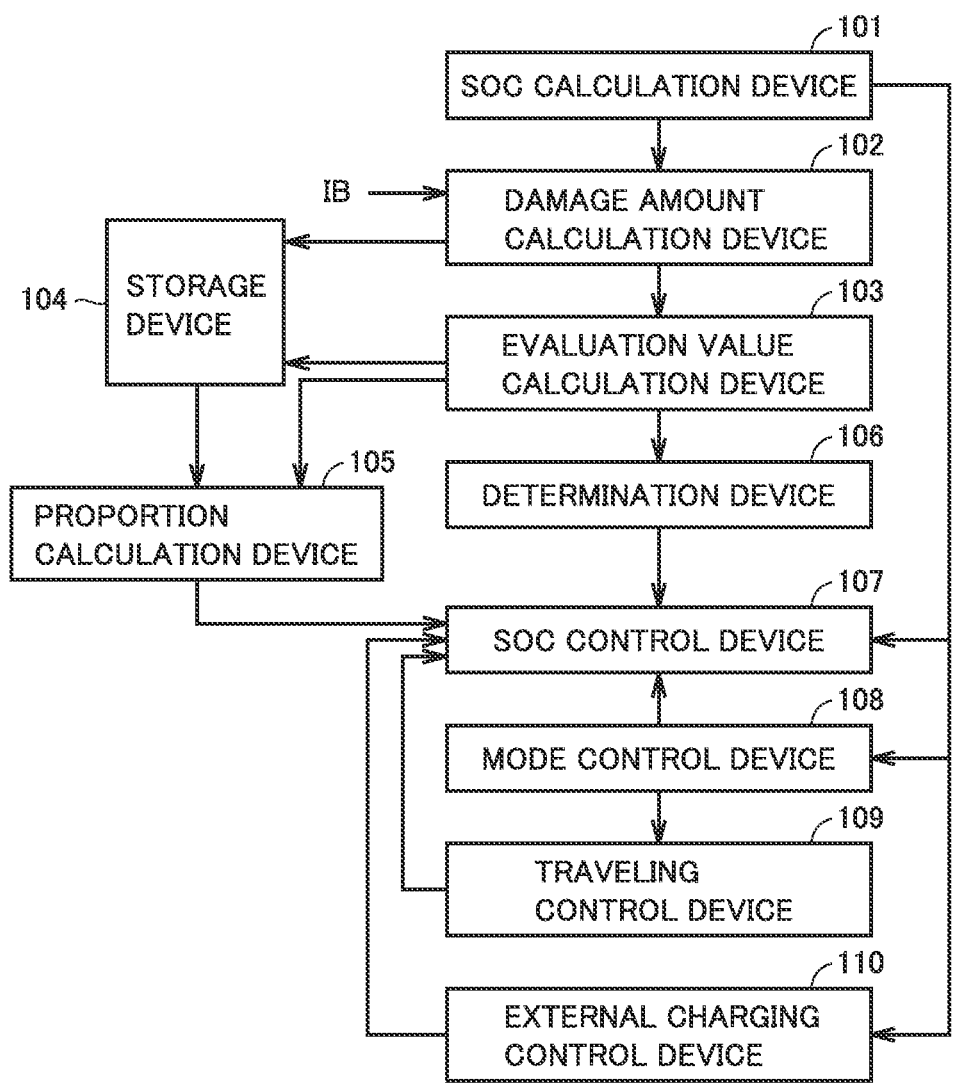
FIG. 6 is a function block diagram of an ECU.

FIG. 6 is a function block diagram of ECU 100. With reference to FIG. 6, ECU 100 includes a SOC calculation device 101, a damage amount calculation device 102, an evaluation value calculation device 103, a storage device 104, a proportion calculation device 105, a determination device 106, a SOC control device 107, a mode control device 108, a traveling control device 109, and an external charging control device 110.

SOC calculation device 101 calculates the actual SOC based on voltage VB of battery 50 detected by voltage sensor 51 and/or current IB of battery 50 detected by current sensor 52. As a specific method for calculating the SOC, various known methods can be used, such as: a method using an integrated value of current IB; a method using an OCV-SOC curve indicating a relation between the SOC and an open circuit voltage (OCV) of battery 50; and the like.

Based on current IB sent to/from battery 50 and a conduction time thereof, damage amount calculation device 102 calculates a damage amount D of battery 50, the damage resulting from the imbalance in the salt concentration in battery 50. Damage amount D is calculated in a predetermined cycle $\Delta t$ based on, for example, the following formula (1):

$$D(N) = D(N-1) - \alpha \times \Delta t \times D(N-1) + (\beta/C) \times IB \times \Delta t \quad (1)$$

Here, D(N) represents the present calculation value of damage amount D, and D(N−1) represents the previous calculation value of damage amount D calculated before cycle $\Delta t$. D(N−1) is stored into storage device 104 upon the previous calculation, and is read from storage device 104 upon the present calculation.

$\alpha \times \Delta t \times D(N-1)$, which is the second term of the right side of the formula (1), is a term representing decrease of damage amount D, and represents a component when the imbalance in the salt concentration is relieved. $\alpha$ is a forgetting coefficient, and is a coefficient corresponding to a diffusion rate of ions in the electrolyte solution of battery 50. Forgetting coefficient $\alpha$ becomes larger as the diffusion rate is higher. The value of $\alpha \times \Delta t$ is set to be a value in the range of 0 to 1. The term representing decrease of damage amount D has a larger value as forgetting coefficient $\alpha$ is larger (i.e., as the diffusion rate of ions is higher) and as cycle $\Delta t$ is longer.

Forgetting coefficient $\alpha$ is dependent on the actual SOC and a temperature of battery 50. A correspondence relation between forgetting coefficient $\alpha$ and each of the actual SOC and the temperature is found in advance by way of an experiment or the like and is stored in storage device 104, and forgetting coefficient $\alpha$ is set based on the actual SOC and the temperature at the time of the calculation. It should be noted that when the temperature of battery 50 is the same, forgetting coefficient $\alpha$ may be set to a larger value as the actual SOC is higher, for example. When the actual SOC is the same, forgetting coefficient $\alpha$ may be set to a larger value as the temperature of battery 50 is higher.

$(\beta/C) \times IB \times \Delta t$, which is the third term of the right side in the formula (1), is a term representing increase of damage amount D, and represents an component when the imbalance in the salt concentration occurs. $\beta$ represents a current coefficient and C represents a limitation threshold value. The term representing increase of damage amount D has a larger value as current IB is larger and as cycle $\Delta t$ is longer.

Current coefficient $\beta$ and limitation threshold value C are dependent on the actual SOC and the temperature of battery 50. A correspondence relation between each of current coefficient $\beta$ and limitation threshold value C and each of the actual SOC and the temperature is determined in advance by an experiment or the like, and is stored in storage device 104, and current coefficient $\beta$ and limitation threshold value C are set based on the actual SOC and the temperature at the time of calculation. It should be noted that when the temperature of battery 50 is the same, limitation threshold value C may be set to a larger value as the actual SOC is higher, for example. When the actual SOC is the same, limitation threshold value C may be set to a larger value as the temperature of battery 50 is higher.

By thus calculating the present damage amount D with the occurrence and relief of the imbalance in the salt concentration being respectively expressed using the terms representing the increase and decrease, a change (increase and decrease) in the imbalance in the salt concentration considered to be a cause of the high-rate deterioration can be ascertained appropriately.

Evaluation value calculation device 103 calculates evaluation value $\Sigma D$ indicating the degree of progress of the high-rate deterioration of battery 50. The state of progress of the high-rate deterioration is evaluated using an integrated value of damage amount D calculated by damage amount calculation device 102. Evaluation value $\Sigma D$ is calculated based on the following formula (2), for example:

$$\Sigma D(N) = \gamma \times \Sigma D(N-1) + \eta \times D(N) \quad (2)$$

In the formula (2), $\Sigma D(N)$ represents the present calculation value of the evaluation value, and $\Sigma D(N-1)$ represents the previous calculation value of the evaluation value calculated before cycle $\Delta t$. $\gamma$ represents an attenuation coefficient and $\eta$ represents a correction coefficient. $\Sigma D(N-1)$ is stored into storage device 104 upon the previous calculation, and is read from storage device 104 upon the present calculation. Both $\gamma$ and $\eta$ are stored in storage device 104 in advance, and are read from storage device 104 upon the present calculation.

Attenuation coefficient $\gamma$ is set to a value smaller than 1. This is in consideration of such a fact that since the imbalance in the salt concentration is relieved due to diffusion of ions with passage of time, the previous evaluation value $\Sigma D(N-1)$ has been decreased when calculating the present evaluation value $\Sigma D(N)$. Correction coefficient $\eta$ is set appropriately.

Based on evaluation value $\Sigma D$ calculated by evaluation value calculation device 103, proportion calculation device 105 calculates proportion X for determining the amount of raising of the target SOC. Calculated proportion X is output to SOC control device 107.

FIG. 7 illustrates a relation between evaluation value ΣD and proportion X. In FIG. 7, the horizontal axis represents the absolute value of evaluation value ΣD. The vertical axes represent proportion X and the amount of raising of the target SOC in the order from the above.

A large absolute value of evaluation value ΣD means that the high-rate deterioration of battery 50 has been progressed, and it is highly required to raise the target SOC. Therefore, as shown in FIG. 7, as the absolute value of evaluation value ΣD is larger in a range in which the absolute value of evaluation value ΣD is larger than the lower limit SOC at which the execution of the high-rate deterioration suppressing control is started, proportion X for securing the EV traveling is made lower and proportion (100−X) (corresponding to the "coefficient" in the present disclosure) for raising the target SOC is made higher. Accordingly, the target SOC is raised promptly to immediately avoid charging and discharging in the low SOC region, whereby the high-rate deterioration is suppressed. As such, when evaluation value ΣD indicates that the high-rate deterioration of battery 50 has been progressed, it is desirable to take precedence on the protection of battery 50 over the suppression of the strange feeling of the user.

A map (or a relational expression or a function) indicating the relation shown in FIG. 7 is stored in storage device 104 in advance. By making reference to this map, proportion X is calculated from evaluation value ΣD. It should be noted that although FIG. 7 shows an example in which proportion X is changed linearly, proportion X may be decreased non-linearly (for example, curvilinearly) or may be decreased stepwisely as the absolute value of evaluation value ΣD becomes larger.

With reference to FIG. 6 again, determination device 106 determines whether or not evaluation value ΣD calculated by evaluation value calculation device 103 has reached criteria value DO. As described above, since the high-rate deterioration has such characteristics that the high-rate deterioration is promoted particularly when a charging current flows in the low SOC region, determination device 106 determines whether or not evaluation value ΣD has been negatively increased to be less than criteria value DO.

SOC control device 107 receives selection information for the control mode from mode control device 108, and receives a determination result in determination device 106 from determination device 106. When the HV mode is selected and determination device 106 has determined that evaluation value ΣD has reached criteria value DO, SOC control device 107 increases the target SOC of battery 50 from lower limit value LL0 to predetermined value SC2 (SC2> LL0) (high-rate deterioration suppressing control).

Mode control device 108 controls switching among the EV mode, the HV mode, and the HVS mode. Specifically, when the external charging is ended, mode control device 108 selects the EV mode. When the actual SOC is decreased to the lower limit SOC due to traveling in the EV mode, mode control device 108 switches from the EV mode to the HV mode. Moreover, mode control device 108 selects the HVS mode in accordance with the user's request. When the user's request is made during the EV mode, the target SOC is maintained at the value at that time. When the user's request is made in the HV mode, for example, the target SOC may be maintained to a value higher than lower limit value LL0 by a predetermined amount, or switching to the HVS mode may be prohibited.

Traveling control device 109 calculates vehicle driving power (requested value) based on the vehicle speed and the accelerator position. Moreover, traveling control device 109 receives the selection information for the control mode from mode control device 108. When the HV mode or the HVS mode is selected, traveling control device 109 further calculates the requested charging power of battery 50 based on the actual SOC, and calculates the vehicle power by adding the requested charging power to the vehicle driving power. It should be noted that when the EV mode is selected, traveling control device 109 assumes the vehicle driving power as the vehicle power.

When the vehicle power is smaller than the engine start threshold value, traveling control device 109 controls vehicle driving device 10 to perform the EV traveling. On the other hand, when the vehicle power is more than or equal to the engine start threshold value, traveling control device 109 controls vehicle driving device 10 to operate engine 11 to perform the HV traveling. On this occasion, when the output of engine 11 is larger than the vehicle power, battery 50 is charged, whereas when the vehicle power is larger than the engine output, battery 50 is discharged.

Moreover, during braking and downhill traveling of the vehicle, traveling control device 109 controls vehicle driving device 10 (motor generator 14 and power converter 16) such that motor generator 14 generates electric power to generate braking power.

When the external power supply is connected to inlet 70, if a predetermined charging execution condition is satisfied, external charging control device 110 performs the external charging. Specifically, external charging control device 110 controls charger 60 to convert, into the voltage level of battery 50, the electric power from the external power supply electrically connected to inlet 70, and output it to battery 50.

<Process Flow of High-Rate Deterioration Suppressing Control>

Figure 8:
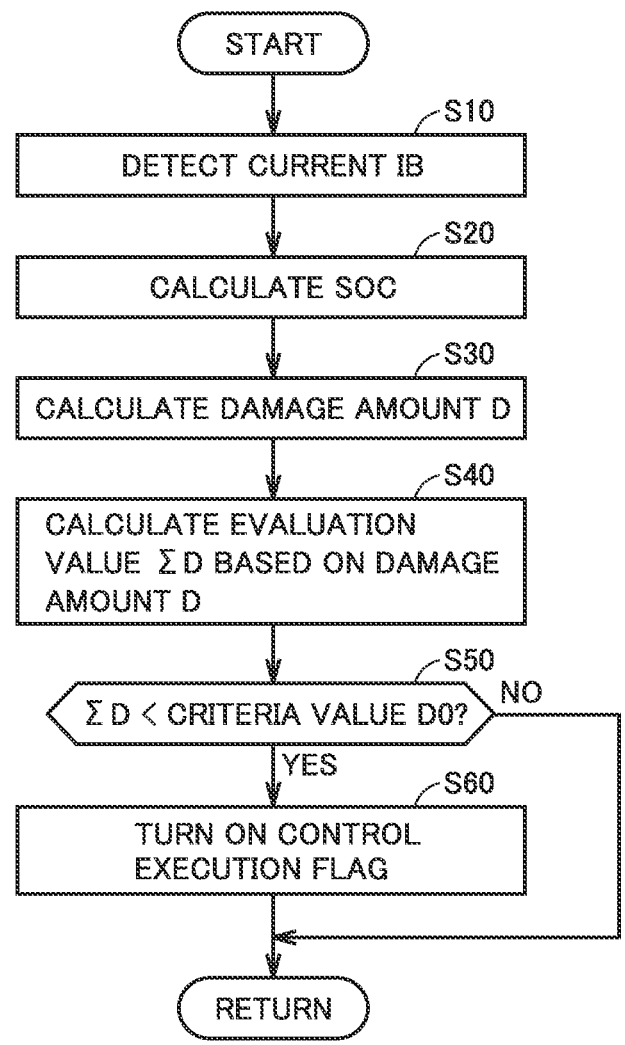
FIG. 8 is a flowchart for illustrating a condition for starting high-rate deterioration suppressing control.

FIG. 8 is a flowchart for illustrating a condition for starting the high-rate deterioration suppressing control. It should be noted that each step (hereinafter, the word "step" will be abbreviated as "S") included in flowcharts shown in FIG. 8 as well as FIG. 9, FIG. 10, FIG. 13, and FIG. 15 described below is invoked from a main routine in each predetermined cycle, and is performed by ECU 100.

With reference to FIG. 8, ECU 100 uses current sensor 52 to detect current IB sent to/from battery 50 (S10). Next, ECU 100 calculates the actual SOC (S20). For the calculation of the SOC, various known methods can be used as described above.

In S30, based on current IB detected in S10 and the actual SOC calculated in S20, ECU 100 calculates damage amount D of battery 50 in accordance with the above-described formula (1). Further, ECU 100 uses the above-described formula (2) to calculate, based on damage amount D calculated in S30, evaluation value ΣD indicating the degree of progress of the high-rate deterioration of battery 50 (S40).

Figure 11:
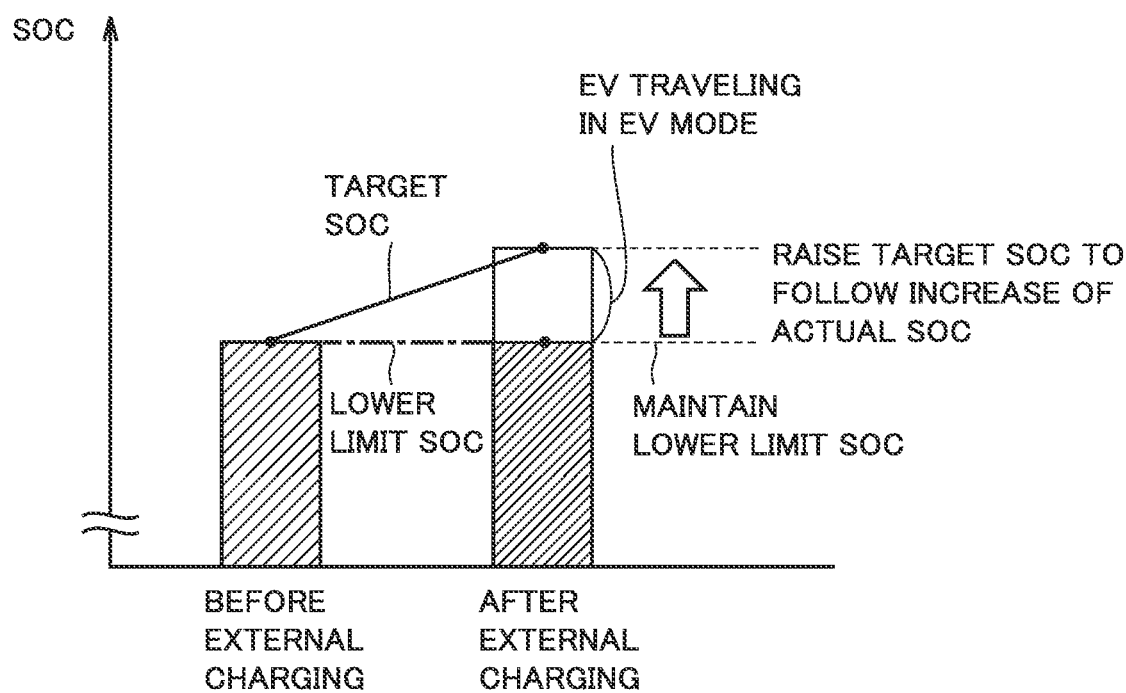
FIG. 11 is a conceptual view for illustrating high-rate deterioration suppressing control in a modification 1 of the embodiment.

Next, ECU 100 determines whether or not evaluation value ΣD is less than criteria value DO (S50). When it is determined that evaluation value ΣD is less than criteria value DO (YES in S50), ECU 100 turns on a control execution flag for executing the high-rate deterioration suppressing control (S60). Accordingly, as illustrated in FIG. 11, the target SOC is eventually raised from lower limit value LL0 to predetermined value SC2 (see FIG. 2 and FIG. 3).

Figure 9:
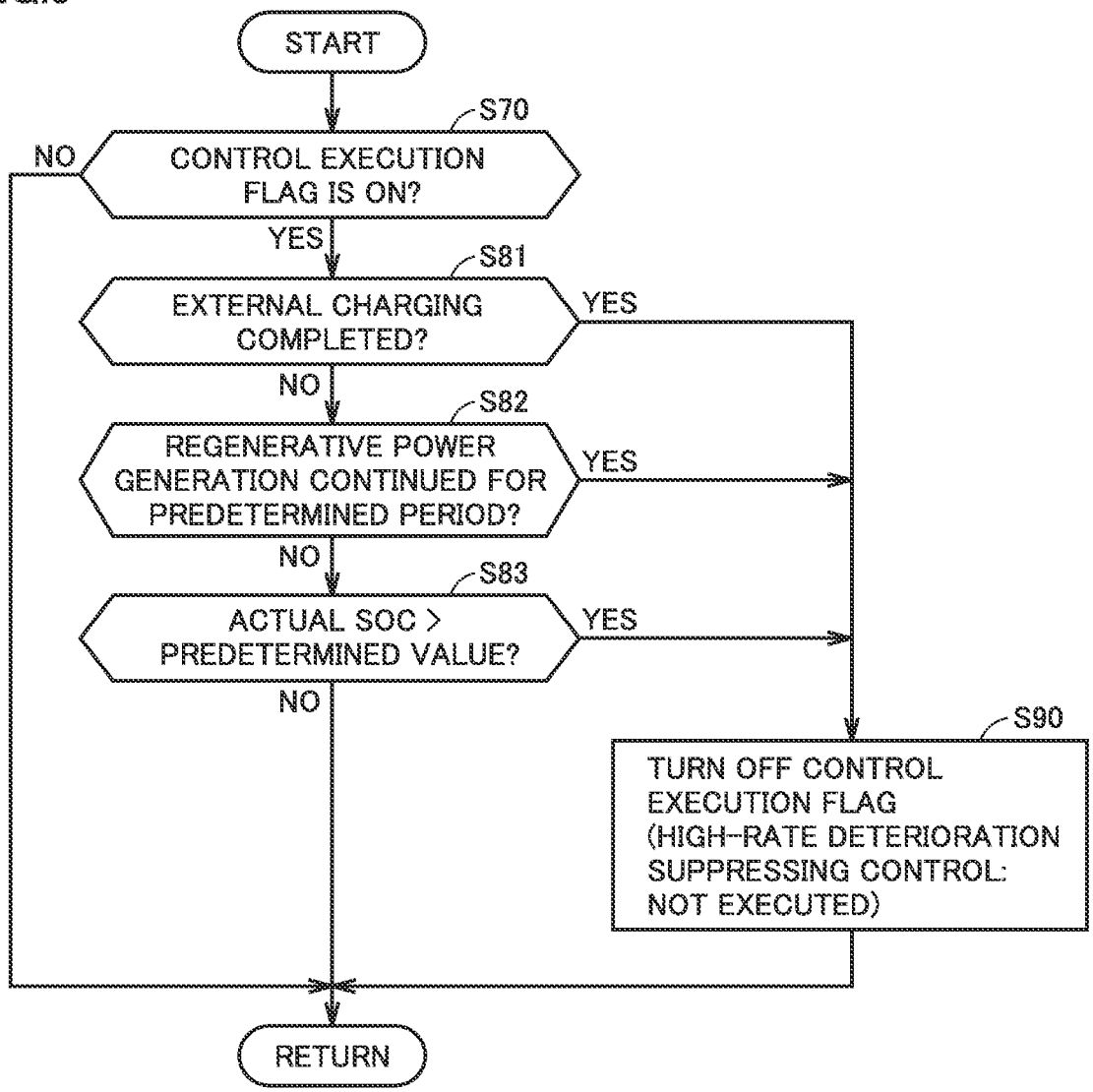
FIG. 9 is a flowchart for illustrating a condition for ending the high-rate deterioration suppressing control.

FIG. 9 is a flowchart for illustrating a condition for ending the high-rate deterioration suppressing control. With reference to FIG. 9, in S70, ECU 100 determines whether or not the control execution flag indicating the execution of the high-rate deterioration suppressing control is on. When the control execution flag is off (NO in S70), the high-rate deterioration suppressing control is not executed, and the process is therefore returned to RETURN.

When the control execution flag is determined as being on in S70 (YES in S70), ECU 100 determines whether or not the external charging has been completed (S81). For example, when a charging connector of the external power supply is detached from inlet 70 (see FIG. 1), it is determined that the external charging has been completed. When it is determined that the external charging has been completed (YES in S81), ECU 100 turns off the control execution flag (S90). Accordingly, the high-rate deterioration suppressing control is not executed. Then, the target SOC is returned from the raised value to lower limit value LL0 for the normal state (state in which the high-rate deterioration suppressing control is not executed).

When it is determined that the external charging has not been completed (inclusive of a case where the external charging has not been started) (NO in S81), ECU 100 determines whether or not regenerative power generation by motor generator 14 has continued for a predetermined period due to, for example, continuous downhill traveling (S82). When it is determined that the regenerative power generation by motor generator 14 has continued for the predetermined period (YES in S82), ECU 100 turns off the control execution flag, whereby the high-rate deterioration suppressing control is not executed (S90).

When it is determined that the regenerative power generation by motor generator 14 has not continued for the predetermined period (NO in S82), ECU 100 determines whether or not the actual SOC is higher than the predetermined value (S83). This predetermined value is set to a level at which restoration from the high-rate deterioration can be expected by continuous discharging in the subsequent EV mode even when the high-rate deterioration suppressing control is not executed. When it is determined that the actual SOC is higher than the predetermined value (YES in S83), ECU 100 proceeds the process to S150 to turn off the control execution flag. That is, the high-rate deterioration suppressing control is not executed. It should be noted that such a case corresponds to a case where the actual SOC is recovered to a high level due to intermittent (not continuous) regenerative power generation by motor generator 14 during the execution of the high-rate deterioration suppressing control, for example.

Figure 10:
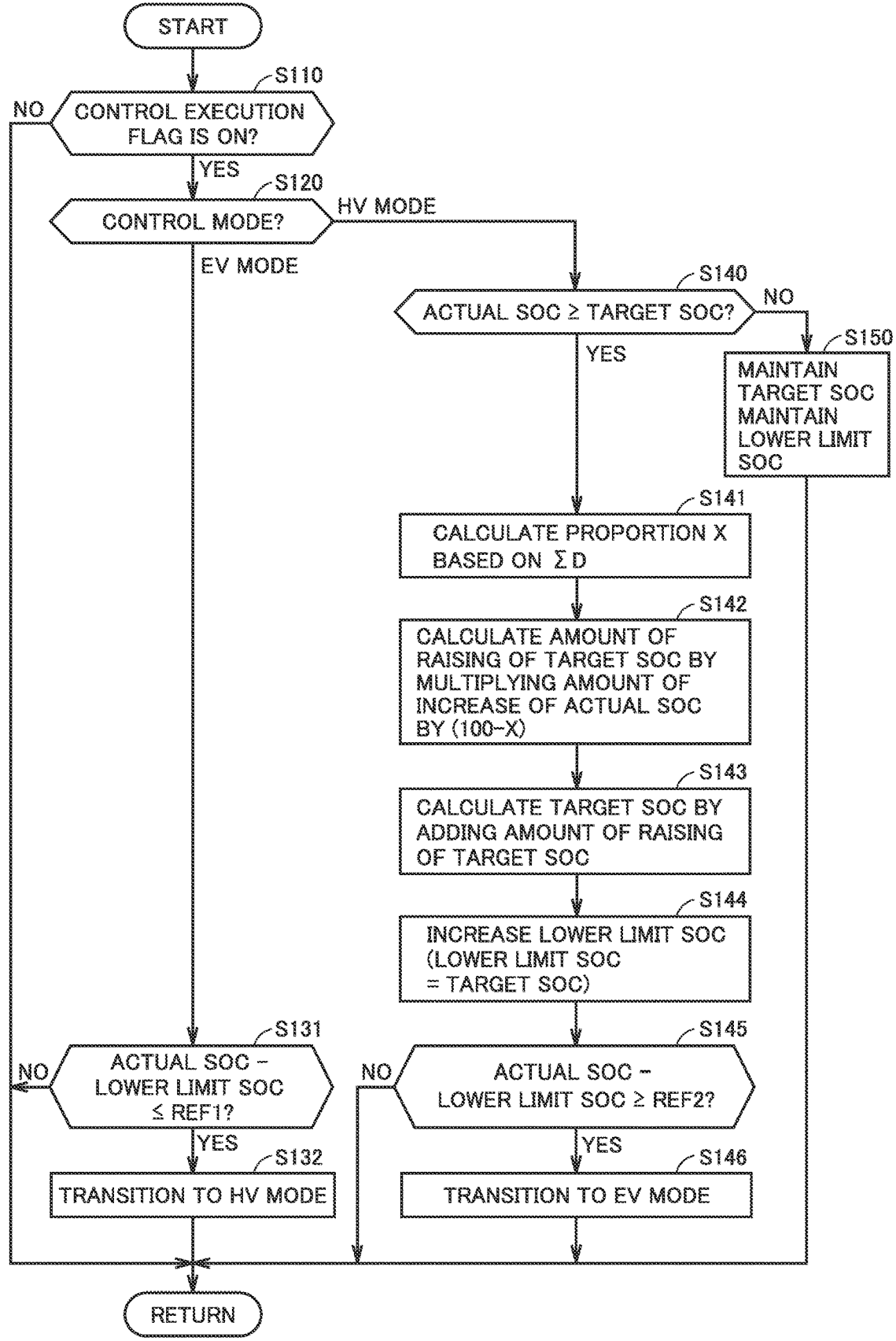
FIG. 10 is a flowchart showing an exemplary process procedure of each of the high-rate deterioration suppressing control and a control mode switching process associated therewith in the present embodiment.

FIG. 10 is a flowchart showing an exemplary process procedure of each of the high-rate deterioration suppressing control and a control mode switching process associated therewith in the present embodiment. With reference to FIG. 10, in S110, ECU 100 determines whether or not the control execution flag for managing execution/non-execution of the high-rate deterioration suppressing control is on. When the control execution flag is off (NO in S110), subsequent processes are not performed and the process is returned to RETURN. In this case, although not shown in the figures, the target SOC is set to lower limit value LL0 when the HV mode is selected, whereas the target SOC is set to the value (SC1 in the example of FIG. 2) at the time of the user's request when the HVS mode is selected.

When it is determined that the control execution flag is on in S110 (YES in S110), ECU 100 proceeds the process to S120 and determines the control mode of vehicle 1. Although the three control modes, i.e., the EV mode, the HV mode, and the HVS mode have been illustrated in FIG. 2, the EV mode and the HV mode will be illustrated in this flowchart and the HVS mode will be described later.

When the control mode is the EV mode ("EV mode" in S120), ECU 100 does not control the lower limit SOC and therefore the lower limit SOC is maintained to be unchanged. Then, ECU 100 determines whether or not a difference between the actual SOC and the lower limit SOC is less than or equal to a reference value REF1 (S131). When the difference between the actual SOC and the lower limit SOC is less than or equal to reference value REF1 (YES in S131), ECU 100 switches the control mode from the EV mode to the HV mode (S132). When the difference between the actual SOC and the lower limit SOC is larger than reference value REF1 (NO in S131), the process of S132 is skipped, switching of the control mode is not performed and the control mode is maintained at the EV mode.

When the control mode is the HV mode in S120 ("HV mode" in S120), ECU 100 proceeds the process to S140 to determine whether or not the actual SOC is more than or equal to the target SOC.

When the actual SOC is less than the target SOC (NO in S140), ECU 100 maintains the target SOC until the actual SOC reaches the target SOC because it is deemed that the target SOC does not need to be immediately raised by way of the HV traveling (electric power generation by motor generator 13 with engine 11 being operated or the like) (S150). The lower limit SOC is also maintained to be unchanged.

On the other hand, when the actual SOC is more than or equal to the target SOC (YES in S140), ECU 100 calculates proportion X for determining the amount of raising of the target SOC, based on evaluation value $\Sigma D$ calculated in S40 (see FIG. 8) (S141). Details of the method for calculating proportion X have been illustrated in FIG. 7 and will not be described here repeatedly.

Then, ECU 100 raises the target SOC based on proportion X calculated in S141. Specifically, a value corrected by multiplying the amount of increase of the actual SOC in the present cycle by proportion (100–X) is employed as the amount of raising of the target SOC (S142). Then, the target SOC in the present cycle is calculated by adding the amount of raising of the target SOC to the target SOC in the previous cycle (S143). Accordingly, the value (SOC or electric power amount) obtained by multiplying the amount of increase of the actual SOC by proportion X is secured for the EV traveling in the HV mode.

Further, ECU 100 also increases the lower limit SOC from the lower limit value LL0 so as to follow the raising of the target SOC (S144). Specifically, ECU 100 calculates the lower limit SOC in the present cycle by adding the amount of raising of the target SOC (value calculated in S142) to the lower limit SOC in the previous cycle. By raising the lower limit SOC in the same manner as the target SOC, the actual SOC is decreased only to around the raised lower limit SOC (> LL0) even when the control mode of vehicle 1 is thereafter switched to the EV mode (see S131). As a result, the charging and discharging of battery 50 in the low SOC region are avoided also in the EV mode, whereby the progress of the high-rate deterioration of battery 50 can be suppressed more securely.

Then, in S145, ECU 100 determines whether or not the difference between the actual SOC and the lower limit SOC are more than or equal to a reference value REF2. Reference value REF2 is a value with which the actual SOC has a margin to the lower limit SOC and with which traveling (EV traveling) by consuming the amount of electric power stored in battery 50 can be performed to a certain extent. When the difference between the actual SOC and the lower limit SOC is more than or equal to reference value REF2 (YES in S145), ECU 100 switches the control mode from the HV mode to the EV mode (S145). When the difference between the actual SOC and the lower limit SOC is less than reference value REF2 (NO in S144), the process of S145 is skipped, switching of the control mode is not performed, and the control mode is maintained at the HV mode.

As described above, in the present embodiment, in the case where the high-rate deterioration suppressing control is executed in the HV mode, the target SOC is raised also when the actual SOC is increased in response to continuous regenerative power generation by motor generator 14. The amount of raising of the target SOC is set to be smaller than the amount of increase of the actual SOC by the regenerative power generation. Accordingly, a SOC (electric power amount) corresponding to a difference between the amount of increase of the actual SOC and the amount of raising of the target SOC is secured for the EV traveling in the HV mode. As a result, it is possible to suppress the user from having such a strange feeling that the EV traveling is not performed irrespective of such a fact that the regenerative power generation has been performed for a long period of time.

More specifically, the amount of raising of the target SOC is set to have proportion (100−X) with respect to the amount of increase of the actual SOC. This proportion (100−X) is set to be higher as the absolute value of evaluation value ΣD is larger (see FIG. 7). Accordingly, the amount of raising of the target SOC becomes larger as the high-rate deterioration of battery 50 is more progressed. By thus raising the target SOC immediately depending on the degree of progress of the deterioration of battery 50, further progress of the high-rate deterioration can be suppressed.

Moreover, during the execution of the high-rate deterioration suppressing control in the HV mode, not only the target SOC is raised but also the lower limit SOC is raised. By also increasing the lower limit SOC, the decrease of the actual SOC in the EV mode (consumption of the amount of electric power stored in battery 50) is suppressed to around the raised lower limit SOC. As a result, the charging and discharging of battery 50 in the low SOC region (around lower limit value LL0) before the raising of the lower limit SOC are avoided, whereby progress of the high-rate deterioration can be suppressed more securely.

It should be noted that although the regenerative power generation by motor generator 14 has been described above as an example, there can occur another situation in which the actual SOC is continuously more than the target SOC. For example, the actual SOC may become more than the target SOC when motor generator 13 generates electric power for a long period of time due to engine 11 being operated to improve heating performance under a low temperature environment. Also in such a case, the series of control described with reference to FIG. 5A to FIG. 10 can be applied.

[Modification 1]

In the embodiment, there has been illustrated the situation in which the SOC (actual SOC) of battery 50 is increased due to the electric power generation by motor generators 13, 14. In a modification 1 of the embodiment, the following describes control for the target SOC and the lower limit SOC under a situation in which the actual SOC is increased due to the external charging.

FIG. 11 is a conceptual view for illustrating high-rate deterioration suppressing control in modification 1 of the embodiment. In the present modification, with reference to FIG. 11, when the actual SOC is increased due to the external charging, the lower limit SOC (indicated by a dashed line) is maintained to a value at the time of starting of the external charging while causing the target SOC (indicated by a solid line) to follow the actual SOC (indicated by a bar graph). Accordingly, as described below, the amount of increase of the actual SOC (indicated in white) due to the external charging is secured for the EV traveling in the EV mode.

Figure 12A:
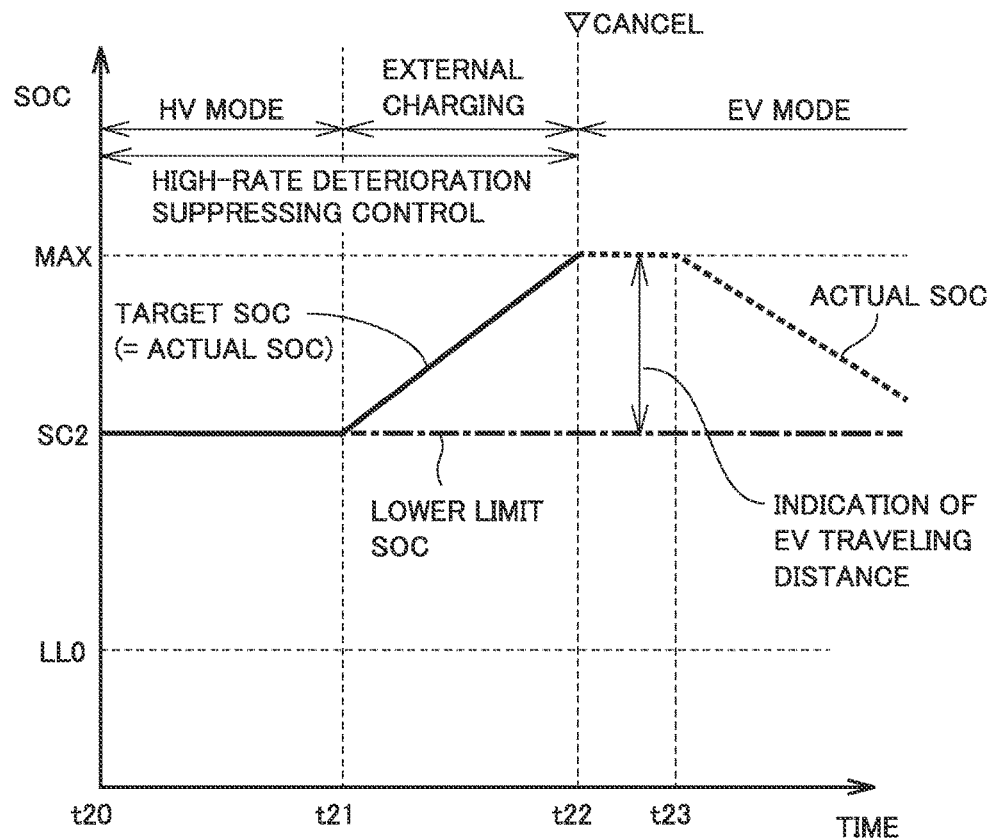
FIG. 12A is a time chart showing the high-rate deterioration suppressing control in modification 1 of the embodiment.
Figure 12B:
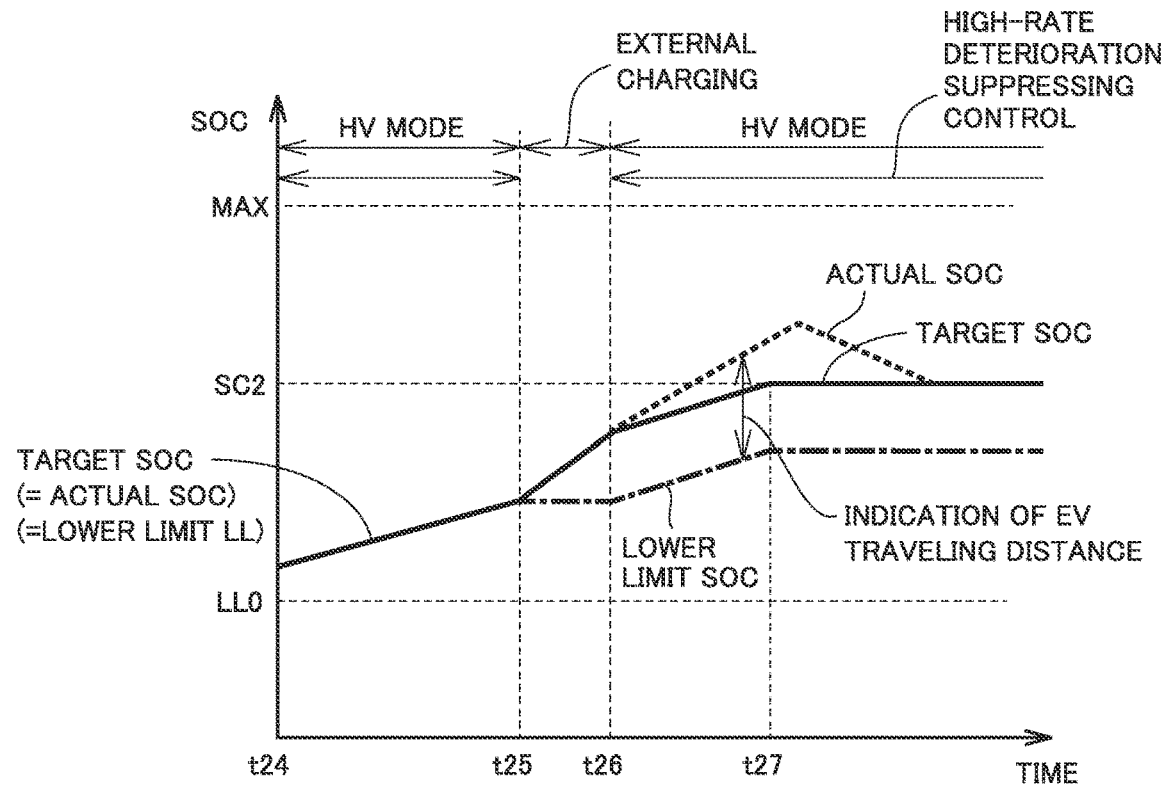
FIG. 12B is a time chart showing the high-rate deterioration suppressing control in modification 1 of the embodiment.

Each of FIG. 12A and FIG. 12B is a time chart showing the high-rate deterioration suppressing control in modification 1 of the embodiment. In each of FIG. 12A, FIG. 12B and FIG. 14 below, the horizontal axis represents passage of time, whereas the vertical axis represents the SOC of battery 50.

With reference to FIG. 12A, in this example, during a period from a time t20 to a time t21, the HV mode is selected as the control mode. Moreover, it is assumed that the high-rate deterioration suppressing control has been started before time t20, and the target SOC and the lower limit SOC have been raised to a predetermined value SC2. The actual SOC also has been increased to the target SOC (here, SC2).

During a period from time t21 to a time t22, vehicle 1 is externally charged, with the result that battery 50 is brought into the fully charged state (SOC=MAX) at time t22. Accordingly, the high-rate deterioration suppressing control is canceled and the EV mode is selected.

The target SOC during the external charging is raised to MAX so as to follow the increase of the actual SOC. On the other hand, the lower limit SOC does not follow the increases of the actual SOC and the target SOC and is maintained at predetermined value SC2.

An EV traveling distance of vehicle 1 in the EV mode is calculated based on a difference (=the actual SOC− the lower limit SOC) between the actual SOC and the lower limit SOC, which is the control start threshold value for the EV mode. Accordingly, if the lower limit SOC is raised also during the external charging, the user can have such a strange feeling that the EV traveling distance is not recovered irrespective of such a fact that the external charging has been performed. To address this, by maintaining the lower limit SOC at predetermined value SC2, the above-described difference is increased by the amount of increase of the actual SOC due to the external charging. Accordingly, the user can check, on a multi information display (MID) (not shown), that the EV traveling distance has been recovered by the external charging, for example. Thus, according to modification 1, occurrence of the strange feeling due to the external charging can be suppressed.

Next, with reference to FIG. 12B, another example of the external charging will be described. Also in this example, during a period from a time t24 to a time t25, the HV mode is selected as the control mode. On the other hand, it is assumed that the high-rate deterioration suppressing control has been started but the target SOC and the lower limit SOC do not reach predetermined value SC2.

The external charging is started at time t25. Accordingly, the target SOC is raised in response to the increase of the actual SOC, whereas the lower limit SOC is maintained at the value obtained at the time of starting of the external charging (time t25).

Before battery 50 reaches the fully charged state, the external charging is ended at a time t26. In this example, the control mode is returned to the HV mode, and then vehicle 1 performs downhill traveling as in the embodiment. The amount of raising of the target SOC when the actual SOC becomes more than the target SOC due to the downhill traveling is set to be smaller than the amount of increase of the actual SOC resulting from the regenerative power generation by motor generator 14. In response to the raising of the target SOC, the lower limit SOC is also raised.

When the target SOC reaches predetermined value SC2 at time t27, the target SOC is thereafter maintained at predetermined value SC2. On this occasion, the lower limit SOC is also stopped being raised and is maintained at a value obtained at time t27. It should be noted that FIG. 12B shows that the downhill traveling of vehicle 1 is ended at a time after time t27 and the actual SOC is decreased toward the target SOC.

Figure 13:
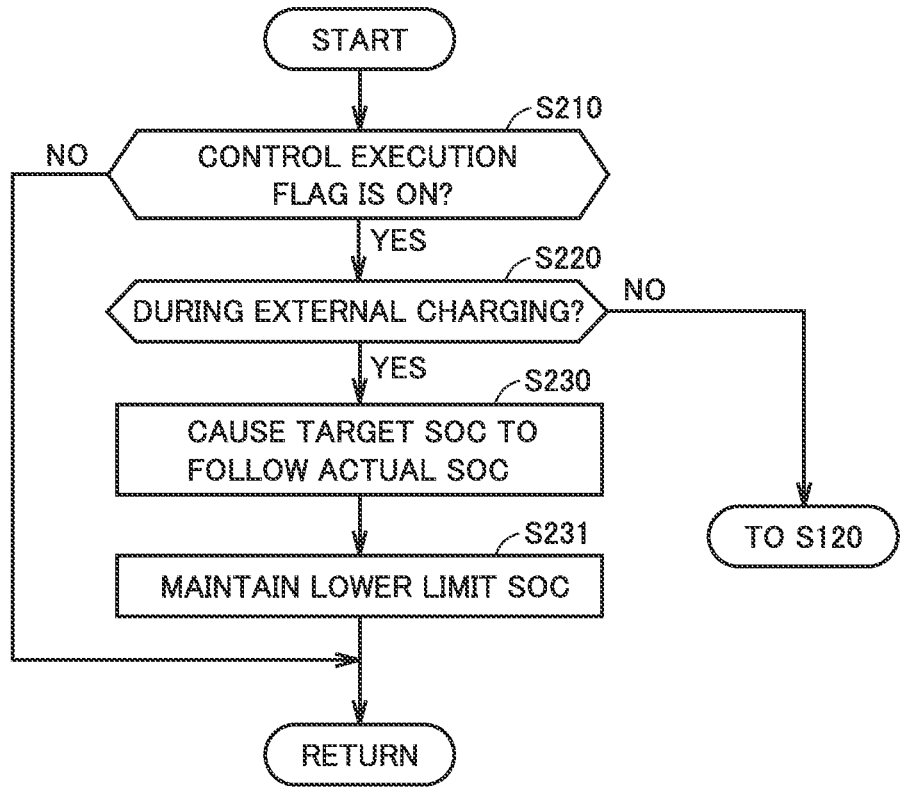
FIG. 13 is a flowchart for illustrating the high-rate deterioration suppressing control in modification 1 of the embodiment.

FIG. 13 is a flowchart showing the high-rate deterioration suppressing control in modification 1 of the embodiment. This flowchart differs from the flowchart (see FIG. 10) in the embodiment in that the processes of S220 to S231 are included.

With reference to FIG. 13, when it is determined that the control execution flag is on in S210 (YES in S210), ECU 100 proceeds the process to S220, and determines whether or not vehicle 1 is being externally charged. When vehicle 1 is being externally charged (YES in S220), ECU 100 raises the target SOC so as to follow the increase of the actual SOC (S230). For example, by setting, as the target SOC in the present cycle, the higher one of the actual SOC in the previous cycle and the target SOC in the previous cycle, the target SOC can be made to follow the actual SOC. On the other hand, ECU 100 maintains the lower limit SOC of battery 50 at the value at the time of starting of the external charging (SC2 in FIG. 12A and the value at time t25 in FIG. 12B) (S231).

It should be noted that when vehicle 1 is not being externally charged (NO in S220), ECU 100 proceeds the process to S120 shown in FIG. 10. For convenience of description, processes after S120 are not shown in FIG. 13, but are the same as corresponding processes in the flowchart shown in FIG. 10.

As described above, in modification 1 of the embodiment, even when the actual SOC is increased during the external charging, the lower limit SOC is maintained to be unchanged. By maintaining the lower limit SOC, the difference between the actual SOC and the lower limit SOC is increased by an amount corresponding to the amount of electric power obtained by the external charging. If the lower limit SOC is raised also during the external charging, the user can have such a strange feeling that the EV traveling distance is not recovered irrespective of such a fact that the external charging has been performed; however, according to modification 1, occurrence of such a strange feeling can be suppressed.

[Modification 2]

In the embodiment, the high-rate deterioration suppressing control in the EV mode or the HV mode has been described. The control mode of vehicle 1 includes the HVS mode in addition to the EV mode and the HV mode. In a modification 2 of the embodiment, the high-rate deterioration suppressing control in the HVS mode will be described.

Figure 14:
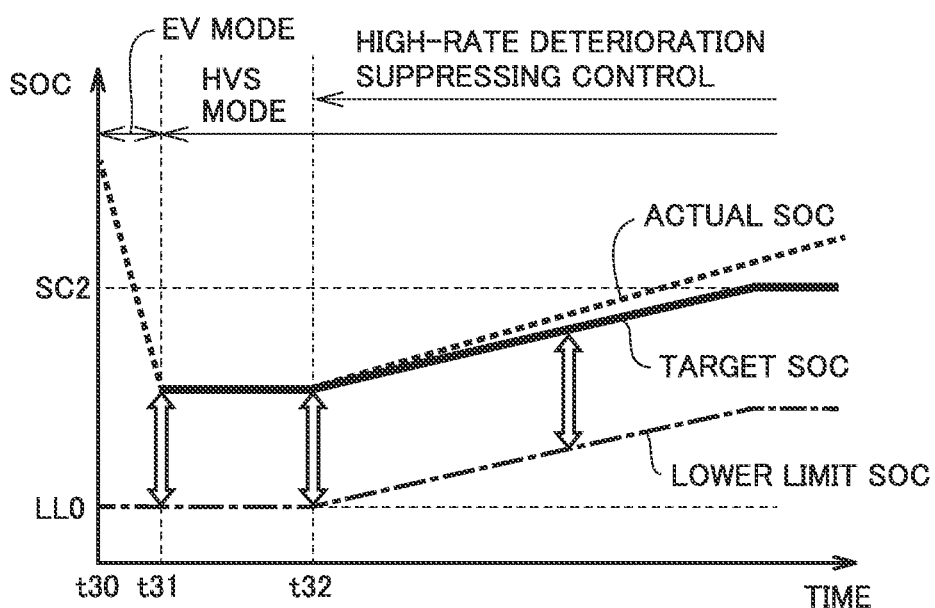
FIG. 14 is a time chart for illustrating high-rate deterioration suppressing control in an HVS mode.

FIG. 14 is a time chart showing the high-rate deterioration suppressing control in the HVS mode. As shown in FIG. 14, at a time t31, the user operates a switch (not shown) to switch the control mode from the EV mode to the HVS mode, for example. In the HVS mode, the actual SOC is maintained at the value obtained at the time of the switching to the HVS mode.

At a time t32, evaluation value $\Sigma D$ reaches criteria value D0 to start the high-rate deterioration suppressing control, thereby increasing the target SOC. Here, the following situation is assumed: the actual SOC is increased due to continuation of downhill traveling of vehicle 1. As with the embodiment, the amount of raising of the target SOC is set to a value obtained by multiplying the amount of increase of the actual SOC by proportion (100−X).

On the other hand, in modification 2, the lower limit SOC is also raised in response to the raising of the target SOC in a state in which the difference between the target SOC and the lower limit SOC is maintained at the value obtained at the time of starting of the execution of the high-rate deterioration suppressing control.

It is also considered to maintain the lower limit SOC to be unchanged without following the target SOC. In this case, the difference between the actual SOC and the lower limit SOC becomes large in response to the increase of the actual SOC, whereby the EV traveling distance of vehicle 1 is extended. On the other hand, when the control mode is then switched from the HVS mode to the EV mode, the actual SOC may be decreased to the lower limit SOC maintained at the relatively low value, with the result that the high-rate deterioration of battery 50 may be progressed.

In contrast, in modification 2, since the lower limit SOC is raised, the actual SOC is decreased only to a relatively high value (raised lower limit SOC), even when the control mode is switched to the EV mode. Therefore, the high-rate deterioration of battery 50 can be suppressed. Moreover, by maintaining the difference between the target SOC and the lower limit SOC, the EV traveling distance attained at the time of the transition to the HVS mode (at the time of the user's operation on the switch) is substantially secured, so that the user is less likely to have such a strange feeling that EV traveling distance has become short even though the lower limit SOC has been raised.

FIG. 15 is a flowchart showing an exemplary process procedure of each of the high-rate deterioration suppressing control and a control mode switching process associated therewith in modification 2 of the embodiment. This flowchart differs from the flowchart (see FIG. 10) in the embodiment in that processes of S350 to S360 are included.

With reference to FIG. 15, ECU 100 determines the control mode (S320). When the control mode is the HVS mode ("HVS mode" in S320), ECU 100 determines whether or not the actual SOC is more than or equal to the target SOC (S350). When the actual SOC is less than the target SOC (NO in S350), ECU 100 maintains the target SOC and also maintains the lower limit SOC to be unchanged, because it is deemed that the target SOC does not need to be raised until the actual SOC reaches the target SOC due to the HV traveling in the HVS mode (S360).

On the other hand, when the actual SOC is more than or equal to the target SOC (YES in S350), ECU 100 calculates proportion X based on evaluation value $\Sigma D$ (S351) as illustrated in FIG. 7. Then, in S352 and S353, ECU 100 raises the target SOC in accordance with proportion X calculated in S351. More specifically, ECU 100 raises the target SOC by an amount obtained by multiplying the amount of increase of the actual SOC by proportion (100−X).

Further, in S354, ECU 100 raises the lower limit SOC to follow the target SOC raised in S352. More particularly, as with the target SOC, ECU 100 also raises the lower limit SOC by an amount obtained by multiplying the amount of increase of the actual SOC by proportion (100−X). Accordingly, the difference between the target SOC and the lower limit SOC is maintained. Thereafter, although not shown in the figures, switching of the control mode is not performed and the control mode is maintained at the HVS mode until the user's operation of canceling the HVS mode is received.

It should be noted that the processes (processes of S330 to S340) in the cases where the EV mode is selected as the control mode in FIG. 15 (the "EV mode" in S320) and where the HV mode is selected (the "HV mode" in S320) are not repeatedly described here because the processes are the same as the corresponding processes of the flowchart (see FIG. 10) in the embodiment.

As described above, in modification 2 of the embodiment, when the high-rate deterioration suppressing control is executed in the HVS mode, the target SOC is raised and the lower limit SOC is also raised. Since the lower limit SOC is raised, the actual SOC is not decreased too much when the control mode is then switched from the HVS mode to the EV mode, whereby the high-rate deterioration of battery 50 can be suppressed. Moreover, the HVS mode is the control mode started in response to the user's operation, and in modification 2, the difference between the target SOC and the lower limit SOC at the time of the user's operation is maintained, whereby the lower limit SOC is prevented from being raised too much. Accordingly, the EV traveling distance at the time of the user's operation is secured, thereby suppressing the user from having such a strange feeling that the EV traveling distance in the EV mode is short.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A hybrid vehicle comprising:
   an engine;
   a motor configured to generate vehicle driving power by consuming electric power, the motor being configured to perform an electric power generation with the engine being operated to perform a regenerative power generation involved in traveling of the hybrid vehicle;
   a secondary battery configured to exchange electric power with the motor; and
   a controller configured to calculate an evaluation value indicating a degree of progress of deterioration of the secondary battery, the deterioration being caused by an imbalance in a salt concentration in the secondary battery, the controller being configured to execute a deterioration suppressing control that raises a target SOC (State of Charge) of the secondary battery when the secondary battery is evaluated to be deteriorated in accordance with the evaluation value, wherein
   the controller is configured to also raise the target SOC when an actual SOC of the secondary battery is increased due to the electric power generation by the motor during the execution of the deterioration suppressing control, and
   the raised target SOC is lower than the increased actual SOC.

2. The hybrid vehicle according to claim 1, wherein
   the controller is configured to calculate the actual SOC and the target SOC in each predetermined calculation cycle during the execution of the deterioration suppressing control, and
   in each calculation cycle, an amount of raising of the target SOC is smaller than an amount of increase of the actual SOC.

3. The hybrid vehicle according to claim 2, wherein the controller is configured to
   employ, as the amount of raising of the target SOC, a value obtained by correcting the amount of increase of the actual SOC in a present calculation cycle by a coefficient, and
   calculate the target SOC in the present calculation cycle by adding the amount of raising of the target SOC to the target SOC in a previous calculation cycle.

4. The hybrid vehicle according to claim 3, wherein the controller is configured to set the coefficient to increase the amount of raising of the target SOC as the secondary battery is evaluated to be more progressed in deterioration in accordance with the evaluation value.

5. The hybrid vehicle according to claim 1, wherein
   the controller is configured to select one control mode of a plurality of control modes including an EV (electric vehicle) mode and an HV (hybrid vehicle) mode,
   the EV mode is a mode in which an amount of electric power stored in the secondary battery is consumed,
   the HV mode is a mode in which when the actual SOC is decreased to a threshold value during the EV mode, the target SOC is adjusted to maintain the actual SOC at the threshold value, and
   during the HV mode and the execution of the deterioration suppressing control, the controller is configured to raise the threshold value together with the target SOC when the actual SOC is increased due to the electric power generation by the motor.

6. The hybrid vehicle according to claim 5, wherein
   the hybrid vehicle is configured to permit performing an external charging for charging the secondary battery using electric power supplied from outside of the hybrid vehicle, and
   during the external charging, the controller is configured to maintain the threshold value at a value obtained at a time of starting to perform the external charging.

7. The hybrid vehicle according to claim 5, wherein
   the plurality of control modes further include an HVS (human visual system) mode in which the target SOC is adjusted in accordance with a user's request so as to maintain the actual SOC to be higher than the threshold value, and
   during the HVS mode and the execution of the deterioration suppressing control, the controller is configured to raise both the target SOC and the threshold value while maintaining a difference between the target SOC and the threshold value, when the actual SOC is increased due to the electric power generation by the motor.

8. A method for controlling a hybrid vehicle,
   the hybrid vehicle including
      an engine,
      a motor configured to generate vehicle driving power by consuming electric power, the motor being configured to perform an electric power generation with the engine being operated and perform a regenerative power generation involved in traveling of the hybrid vehicle, and
      a secondary battery configured to exchange electric power with the motor, the method comprising:
   calculating an evaluation value indicating a degree of progress of deterioration of the secondary battery, the deterioration being caused by an imbalance in a salt concentration in the secondary battery; and
   executing a deterioration suppressing control that raises a target SOC (State of Charge) of the secondary battery when the secondary battery is evaluated to be deteriorated in accordance with the evaluation value, wherein the target SOC is also raised when an actual SOC of the secondary battery is increased due to the electric power generation by the motor during the execution of the deterioration suppressing control, and the raised target SOC is lower than the increased actual SOC.

* * * * *

UNITED STATES PATENT AND TRADEMARK OFFICE
CERTIFICATE OF CORRECTION

PATENT NO. : 11,007,897 B2
APPLICATION NO. : 16/299480
DATED : May 18, 2021
INVENTOR(S) : Yu Nakao et al.

Page 1 of 1

It is certified that error appears in the above-identified patent and that said Letters Patent is hereby corrected as shown below:

In the Specification

In Column 5, Line(s) 7, delete "SOC FIG. 5A" and insert --SOC. FIG. 5A--.

In Column 13, Line(s) 39, delete "DO" and insert --D0--, therefor.

In Column 13, Line(s) 44, delete "DO" and insert --D0--, therefor.

In Column 13, Line(s) 50, delete "DO" and insert --D0--, therefor.

In Column 19, Line(s) 65, delete "DO" and insert --D0--, therefor.

Signed and Sealed this
Twentieth Day of July, 2021

Drew Hirshfeld
*Performing the Functions and Duties of the
Under Secretary of Commerce for Intellectual Property and
Director of the United States Patent and Trademark Office*